US007476869B2

(12) United States Patent
Burtner et al.

(10) Patent No.: US 7,476,869 B2
(45) **Date of Patent: *Jan. 13, 2009**

(54) GAS DISTRIBUTOR FOR ION SOURCE

(75) Inventors: David M. Burtner, Belmont, MA (US); Scott A. Townsend, Fort Collins, CO (US); Daniel E. Siegfried, Fort Collins, CO (US)

(73) Assignee: Veeco Instruments, Inc., Woodbury, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/622,981

(22) Filed: Jan. 12, 2007

(65) Prior Publication Data

US 2007/0273289 A1 Nov. 29, 2007

Related U.S. Application Data

(63) Continuation-in-part of application No. 11/061,254, filed on Feb. 18, 2005, now Pat. No. 7,342,236.

(60) Provisional application No. 60/759,089, filed on Jan. 13, 2006.

(51) Int. Cl.
*H01J 49/10* (2006.01)
*H01J 37/08* (2006.01)
*H01J 7/24* (2006.01)

(52) U.S. Cl. .................. 250/423 R; 250/424; 250/426; 315/111.81; 315/111.91; 315/111.41; 313/362.1

(58) Field of Classification Search ................. 250/426, 250/424, 423 R; 315/111.41, 111.81, 111.91; 313/362.1
See application file for complete search history.

(56) References Cited

U.S. PATENT DOCUMENTS 4,129,772 A 12/1978 Navratil et al.

(Continued)

FOREIGN PATENT DOCUMENTS

GB 1383128 2/1975

(Continued)

OTHER PUBLICATIONS

International Searching Authority; Korean Intellectual Property Office as Receiving Office; Written Opinion of the International Searching Authority (Form PCT/ISA/237) for international application No. PCT/US2007/060546; Aug. 7, 2007; 13 pages.

(Continued)

*Primary Examiner*—Nikita Wells
(74) *Attorney, Agent, or Firm*—Hensley Kim & Holzer, LLC

(57) ABSTRACT

A gas distributor is easily removable and replaceable in an ion source. The ion source has a removable anode assembly, including the gas distributor, that is separable and from a base assembly to allow for ease of servicing consumable components of the anode assembly. The gas distributor may be mounted to a thermal control plate in the anode assembly with several set screws. The gas distributor may be disk-shaped with counterbores in a surface to recess the heads of the set screws. Alternately, the gas distributor may be clamped or held in place by other structures or components of the ion source.

25 Claims, 26 Drawing Sheets

U.S. PATENT DOCUMENTS

| | | | | |
|---|---|---|---|---|
| 4,385,979 | A | 5/1983 | Pierce et al. | |
| 4,562,355 | A | 12/1985 | Keller et al. | |
| 4,862,032 | A | 8/1989 | Kaufman et al. | |
| 5,576,600 | A | 11/1996 | McCrary et al. | |
| 5,889,371 | A | 3/1999 | Boyarsky | |
| 5,973,447 | A | 10/1999 | Mahoney et al. | |
| 6,238,588 | B1 | 5/2001 | Collins et al. | |
| 6,608,431 | B1 | 8/2003 | Kaufman | |
| 7,025,863 | B2 | 4/2006 | Seeli et al. | |
| 7,342,236 | B2 * | 3/2008 | Burtner et al. | 250/426 |
| 2002/0163289 | A1 | 11/2002 | Kaufman et al. | |
| 2005/0248284 | A1 | 11/2005 | Burtner at al. | |
| 2007/0125966 | A1 * | 6/2007 | Burtner et al. | 250/492.21 |
| 2007/0166599 | A1 * | 7/2007 | Burtner et al. | 429/40 |
| 2007/0273288 | A1 * | 11/2007 | Burtner et al. | 315/111.81 |

FOREIGN PATENT DOCUMENTS

| | | |
|---|---|---|
| WO | 00/05742 | 2/2000 |

OTHER PUBLICATIONS

International Searching Authority; Korean Intellectual Property Office as Receiving Office; International Search Report (Form PCT/ISA/210) for international application No. PCT/US2007/060546; Aug. 7, 2007; 3 pages.

Veeco Instruments, Inc., Mark III and Hollow Cathode Technical Manual, Manual #425188 Rev. A, pp. 36-38; and 59-70 (18 pages total), Copyright 2002 Veeco Instruments, Inc.

Intlvac, Inc. Mark II Ion Source, Water-Cooling Retro-Fit, Jun. 10, 2005, http://www.intlvac.com/PDF/water_cooling_upgrade.pdf, (4 pages), Canada.

Commonwealth Scientific Corporation, Guide to Operations for the One-Meter Linear End-Hall Ion Source with Hollow Cathode Electron Source, (Jul. 1999), pp. 30; 77-78.

Veeco Instruments, Inc., 20 cm Linear End Hall Technical Manual, (2002).

European Patent Office, Supplementary European Search Report (EPO form 1503) for European Patent Application No. EP 05738849; Jun. 9, 2008, 2008; (3 pages).

* cited by examiner

GAS DISTRIBUTOR FOR ION SOURCE

RELATED APPLICATIONS

The present application claims the benefit of priority pursuant to U.S.C. § 119(e) of U.S. provisional application no. 60/759,089 filed 13 Jan. 2006 entitled "Ion Source with Removable Anode Section," which is hereby incorporated by reference herein in its entirety. The present application is a continuation-in-part of U.S. patent application Ser. No. 11/061,254 filed 18 Feb. 2005, now U.S. Pat. No. 7,342,236, entitled "Fluid-cooled Ion Source," which is hereby incorporated by reference herein in its entirety. The present application is also related to U.S. provisional application No. 60/547,270 filed 23 Feb. 2004 entitled "Water-cooled Ion Source" and Patent Cooperation Treaty application no. PCT/US2005/005537 filed 22 Feb. 2005 entitled "Fluid-cooled Ion Source," each of which is hereby incorporated herein by reference in its entirety. The present application is further related to U.S. patent application Ser. No. 11/622,949 entitled "Ion source with removable anode assembly," U.S. patent application Ser. No. 11/622,966 entitled "Thermal control plate for ion source," and U.S. patent application Ser. No. 11/622,989 entitled "Thermal transfer sheet for ion source," each of which is filed contemporaneously herewith and is hereby incorporated herein by reference in its entirety.

TECHNICAL FIELD

The invention relates generally to ion sources and components thereof.

BACKGROUND

Ion sources generate a large amount of heat during operation. The heat is a product of the ionization of a working gas, which results in a high-temperature plasma in the ion source. To ionize the working gas, a magnetic circuit is configured to produce a magnetic field in an ionization region of the ion source. The magnetic field interacts with a strong electric field in the ionization region, where the working gas is present. The electrical field is established between a cathode, which emits electrons, and a positively charged anode, and the magnet circuit is established using a magnet and a pole piece made of magnetically permeable material. The sides and base of the ion source are other components of the magnetic circuit. In operation, the ions of the plasma are created in the ionization region and are then accelerated away from the ionization region by the induced electric field.

The magnet, however, is a thermally sensitive component, particularly in the operating temperature ranges of a typical ion source. For example, in typical end-Hall ion sources cooled solely by thermal radiation, discharge power is typically limited to about 1000 Watts, and ion current is typically limited to about 1.0 Amps to prevent thermal damage, particularly to the magnet. To manage higher discharge powers, and therefore higher ion currents, direct anode cooling systems have been developed to reduce the amount of heat reaching the magnet and other components of an ion source. For example, by pumping coolant through a hollow anode to absorb the excessive heat of the ionization process, discharge powers as high as 3000 Watts and ion currents as high as 3.0 Amps may be achieved. Alternative methods of actively cooling the anode have been hampered by the traditional difficulties of transferring heat between distinct components in a vacuum.

There are also components in an ion source that require periodic maintenance. In particular, a gas distributor through which the working gas flows into the ionization region erodes during operation or otherwise degenerates over time. Likewise, the anode must be cleaned when it becomes coated with insulating process material, and insulators must be cleaned when they become coated with conducting material. As such, certain ion source components are periodically replaced or serviced to maintain acceptable operation of the ion source.

Unfortunately, existing approaches for cooling the ion source require coolant lines running to and pumping coolant through a hollow anode. Such configurations present obstacles for constructing and maintaining ion sources, including the need for electrical isolation of the coolant lines, the risk of an electrical short through the coolant from the anode to ground, degradation and required maintenance of the coolant line electrical insulators, and the significant inconvenience of having to disassemble the coolant lines to gain access to serviceable components, like the gas distributor, the anode, and various insulators.

SUMMARY

A gas distributor is disclosed that is easily removable and replaceable in an ion source. The ion source has a removable anode assembly, including the gas distributor, that is separable and from a base assembly to allow for ease of servicing consumable components of the anode assembly. The gas distributor may be mounted to a thermal control plate in the anode assembly with several set screws. The gas distributor may be disk-shaped with counterbores in a surface to recess the heads of the set screws. Alternately, the gas distributor may be clamped or held in place by other structures or components of the ion source.

In one implementation, a gas distributor is provided for incorporation in an anode assembly of an ion source. The gas distributor may be formed as a disk with a top surface and a bottom surface. The disk may define two or more apertures for acceptance of respective fastening bolts. Additionally, the apertures are positioned with respect to a toroid-shaped anode in the anode assembly such that the apertures in the gas distributor are positioned outside an inner diameter of the toroid-shaped anode.

In another implementation, a gas distributor is provided incorporation in an anode assembly of an ion source. The gas distributor may be formed as a disk with a top surface and a bottom surface. The disk may define three apertures spaced equidistantly about and adjacent to an outer circumference of the gas distributor for acceptance of respective fastening bolts. Each of the three apertures may comprise a counterbore of a depth substantially equivalent to or slightly greater than a thickness the nuts threaded on each of the fastening bolts. Additionally, the three apertures may be positioned with respect to a toroid-shaped anode in the anode assembly such that the three apertures are positioned outside an inner diameter of the toroid-shaped anode.

In a further implementation, a gas distributor is provided for incorporation in an anode assembly of an ion source. The gas distributor may be formed of two components: an annular clamping ring and a plate component retained within the annular clamping ring. Alternatively, the gas distributor may be in the form of a plate component defining gas paths and be retained within a recess in the bottom of a toroid-shaped anode between the anode and the thermal control plate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various embodiments and implementations as further illustrated in the accompanying drawings and defined in the appended claims.

BRIEF DESCRIPTIONS OF THE DRAWINGS

DETAILED DESCRIPTION

Figure 1:
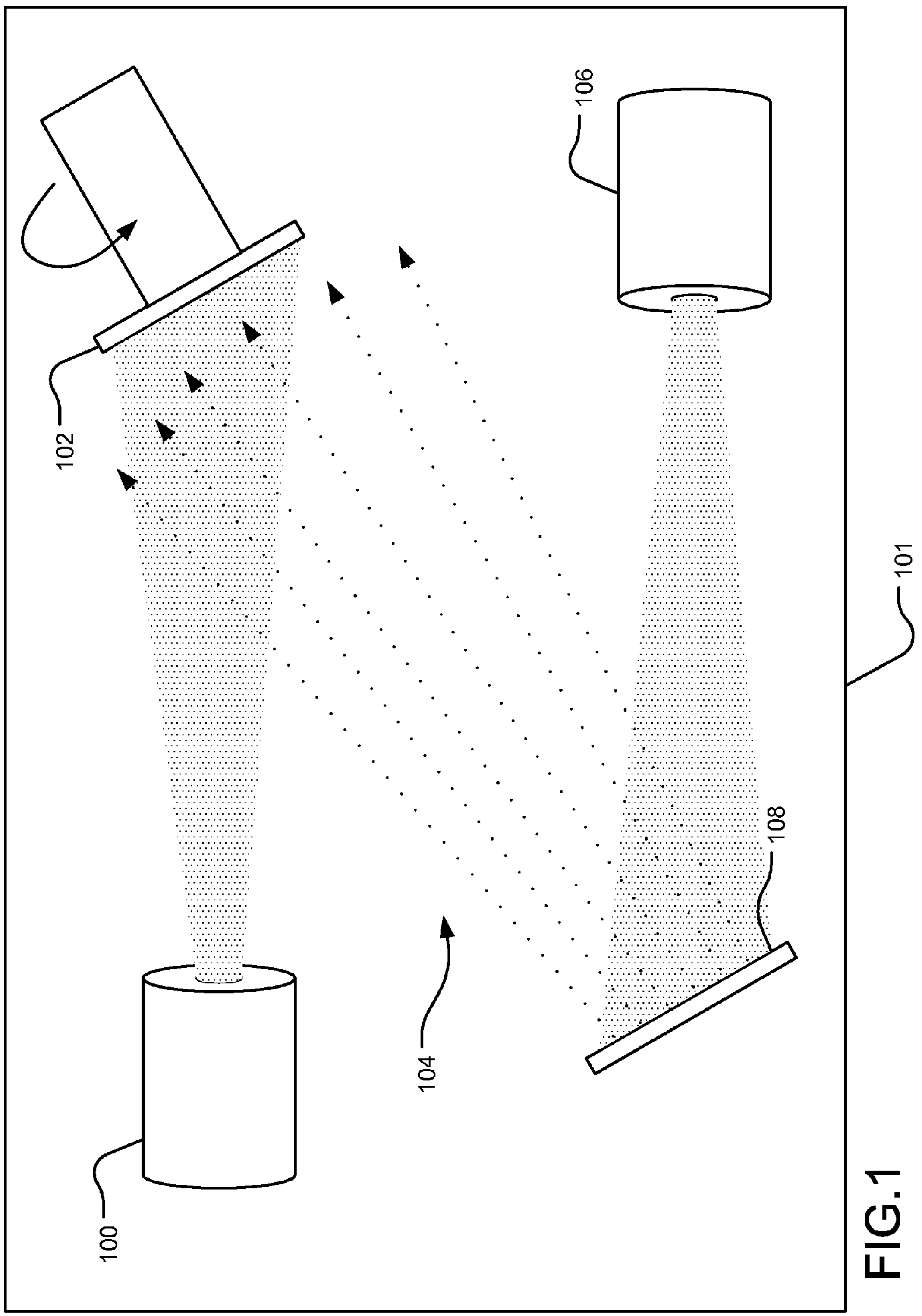
FIG. 1 illustrates an exemplary operating environment of an ion source in a deposition chamber.

FIG. 1 illustrates an exemplary operating environment of an ion source 100 in a deposition chamber 101, which typically holds a vacuum. The ion source 100 represents an end-Hall ion source that assists in the processing of a substrate 102 by other material 104, although other types of ion sources and applications are also contemplated. In the illustrated environment, the substrate 102 is rotated in the deposition chamber 101 as an ion source 106 sputters material 104 from a target 108 onto the substrate 102. The sputtered material 104 is therefore deposited on the surface of the substrate 102. In an alternative implementation, the deposited material may be produced by an evaporation source or other deposition source. It should be understood that the ion source 106 may also be an embodiment of a fluid-cooled ion source described herein. The ion source 100 is directed to the substrate 102 to improve (i.e., assist with) the deposition of the material 104 on the substrate 102.

Accordingly, the ion source 100 is cooled using a liquid or gaseous coolant (i.e., a fluid coolant) flowing through a cooling plate as described herein. Exemplary coolants may include without limitation distilled water, tap water, nitrogen, helium, ethylene glycol, and other liquids and gases. It should be understood that heat transfer between surfaces of adjacent bodies in a vacuum is less efficient than in a non-vacuum—the physical contact between two adjacent surfaces is typically minimal at the microscopic level and there is virtually no thermal transfer by convection in a vacuum. Therefore, to facilitate or improve such heat transfer, certain adjacent surfaces may be machined, compressed, coated or otherwise interfaced to enhance the thermal conductivity of the assembled components.

Furthermore, maintenance requirements and electrical leakage are also important operating considerations. Therefore, the configuration of the ion source 100 also allows an assembly of components to be easily removed from and inserted to the ion source body in convenient subassemblies, thereby facilitating maintenance of the ion source components. These components may be insulated or otherwise isolated to prevent electrical breakdown and leakage of current (e.g., from the anode through a grounded component, from the anode through the coolant to ground, etc.).

Figure 2:
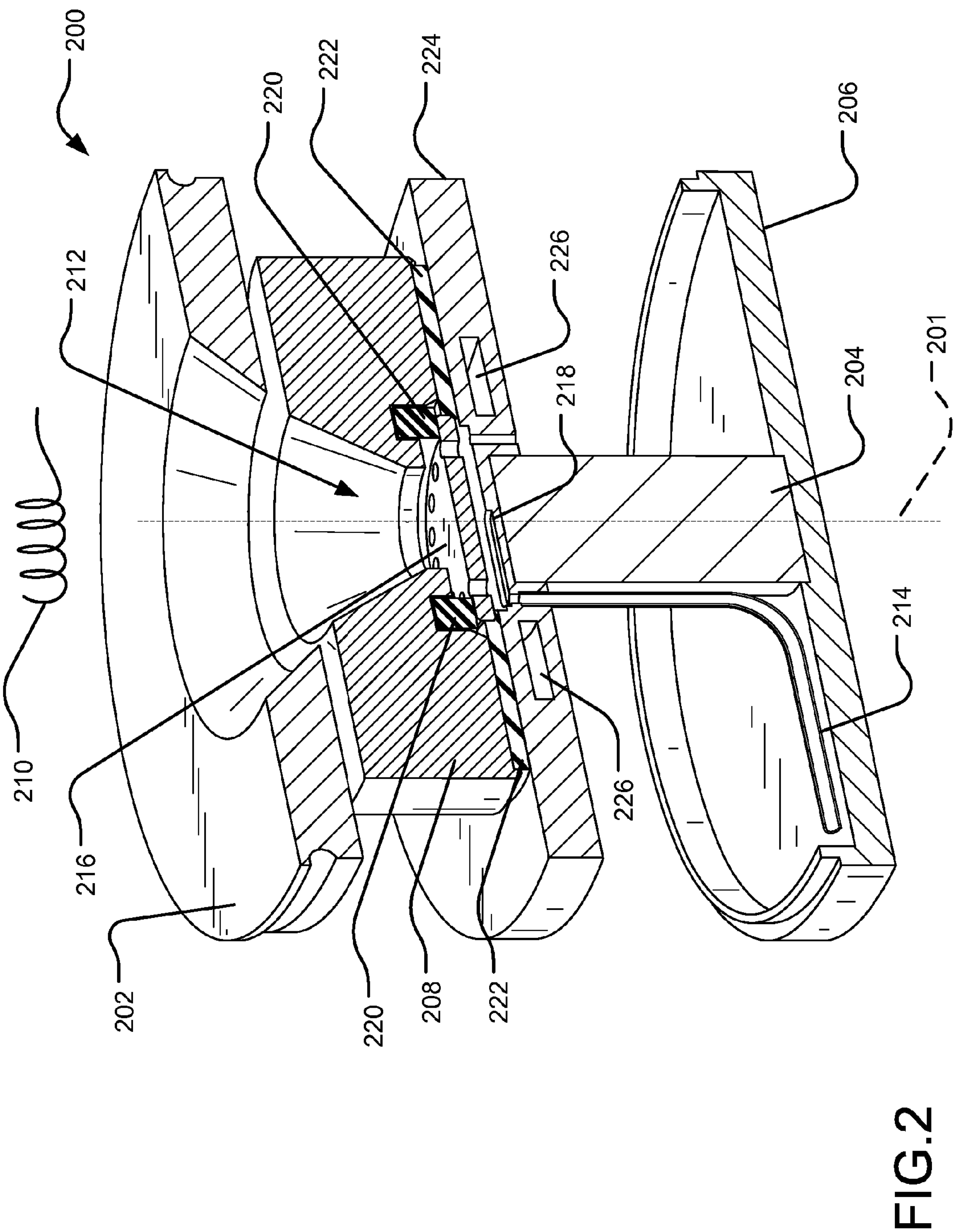
FIG. 2 illustrates a cross-sectional view of an exemplary fluid-cooled ion source.

FIG. 2 illustrates a cross-sectional view of an exemplary fluid-cooled ion source 200. The positions of the ion source components are described herein relative to an axis 201. The axis 201 and other axes described herein are illustrated to help describe the relative position of one component along the axis with respect to another component. There is no requirement that any component actually intersect the illustrated axes. (Note that some component elements of the ion source 200 have been removed from the cross-sectional view in FIG. 2 to help illustrate certain other components within the ion source 200 and their relationships.)

The pole piece 202 is made of magnetically permeable material and provides one pole of the magnetic circuit. A magnet 204 provides the other pole of the magnetic circuit. The pole piece 202 and the magnet 204 are connected through a magnetically permeable base 206 and a magnetically permeable body sidewall (not shown) to complete the magnetic circuit. The magnets used in a variety of ion source implementations may be permanent magnets or electromagnets and may be located along other portions of the magnetic circuit.

In the illustrated implementation, an anode 208, spaced beneath the pole piece 202 by insulating spacers (not shown), is powered to a positive electrical potential while the pole piece 202, the magnet 204, the base 206, and the sidewall are grounded (i.e., have a neutral electrical potential). The cathode 210 is electrically active, but has a net DC potential that is near ground potential relative to the anode potential. This arrangement sets up an interaction between a magnetic field and an electric field in an ionization region 212, where the molecules of the working gas are ionized to create a plasma. Eventually, the ions escape the ionization region 212 and are accelerated in the direction of the cathode 210 and toward a substrate.

In the implementation shown, a hot-filament type cathode is employed to generate electrons. A hot filament cathode works by heating a refractory metal wire by passing an alternating current through the hot filament cathode until its temperature becomes high enough that thermionic electrons are emitted. The electrical potential of the cathode is near ground potential, but other electrical variations are possible. In another typical implementation, a hollow-cathode type cathode is used to generate electrons. A hollow-cathode electron source operates by generating a plasma in a working gas and extracting electrons from the plasma by biasing the hollow cathode a few volts negative of ground, but other electrical variations are possible. Other types of cathodes beyond these two are contemplated.

The working gas is fed to the ionization region through a duct 214 and released behind a gas distributor 216 through an outlet 218. In operation, the illustrated gas distributor 216 is electrically isolated from the other ion source components by a ceramic isolator 220 and a thermally conductive, electrically insulating thermal transfer interface component 222. Therefore, the gas distributor 216 is left to float electrically, although the gas distributor 216 may be grounded or charged to a non-zero potential in alternative implementations. The gas distributor 216 assists in uniformly distributing the working gas in the ionization region 212. In many configurations, the gas distributor 216 is made of stainless steel and requires periodic removal and maintenance. Other exemplary materials for manufacturing a gas distributor include without limitation graphite, molybdenum, titanium, tantalum, boron nitride, aluminum nitride, alumina or alumina oxide, silicon oxide (i.e., quartz), silicon carbide, silica, mica or any high temperature conductive or ceramic composite.

The operation of the ion source 200 generates a large amount of heat, which is primarily transferred to the anode 208. For example, in a typical implementation, a desirable operating condition may be on the order of 3000 watts, 75% of which may represent waste heat absorbed by the anode 208. Therefore, to effect cooling, the bottom surface of the anode 208 presses against the top surface of the thermal transfer interface component 222, and the bottom surface of the thermal transfer interface component 222 presses against the top surface of a cooling plate 224. The cooling plate 224 includes a coolant cavity 226 through which coolant flows. In one implementation, the thermal transfer interface component 222 includes a thermally conductive, electrically insulating material, such as boron nitride, aluminum nitride or a boron nitride/aluminum nitride composite material (e.g., BIN77, marketed by GE-Advanced Ceramics). It should be understood that the thermal transfer interface component 222 may be a single layer or multi-layer interface component.

Generally, a thermally conductive, electrically insulating material having a lower elastic modulus works better in the ion source environment than materials having a higher elastic modulus. Materials with a lower elastic modulus can tolerate higher thermal deformation before material failure than higher elastic modulus materials. Furthermore, in a vacuum, even very small gaps between adjacent surfaces will greatly reduce heat transfer across the interface. Accordingly, lower elastic modulus materials tend to conform well to small planar deviations in thermal contact surfaces and minimize gaps in the interface, therefore enhancing thermal conductivity between the thermal contact surfaces.

In the illustrated implementation, the thermal transfer interface component 222 electrically isolates the cooling plate 224 from the positively charged anode 208 but also provides high thermal conductivity. Therefore, the thermal transfer interface component 222 allows the cooling plate 224 to be kept at ground potential while the anode has a high positive electrical potential. Furthermore, the cooling plate 224 cools the anode 208 and thermally isolates the magnet 204 from the heat of the anode 208.

It is desirable that as much working gas as possible travel through the ionization region 212. Gas molecules not passing through the ionization region 212 cannot be ionized and do not contribute to ion beam output. Therefore, gas molecules that are released from the ion source 200 into a process chamber without passing through the ionization region 212 represent a loss of efficiency and increase the process chamber pressure, which is often desired to be as low as possible. For maximum gas utilization, after the working gas emerges from the outlet 218 it should be prevented from leaking behind the gas distributor 216 and then behind and around the outside diameter of the anode 208 so that it is forced to pass through the ionization region 212. In the implementation shown in FIG. 2, the thermal transfer interface component 222 serves to fill gaps between the anode 208 and the cooling plate 224 while maintaining electrical isolation between the anode 208 and the cooling plate 224.

Figure 3:
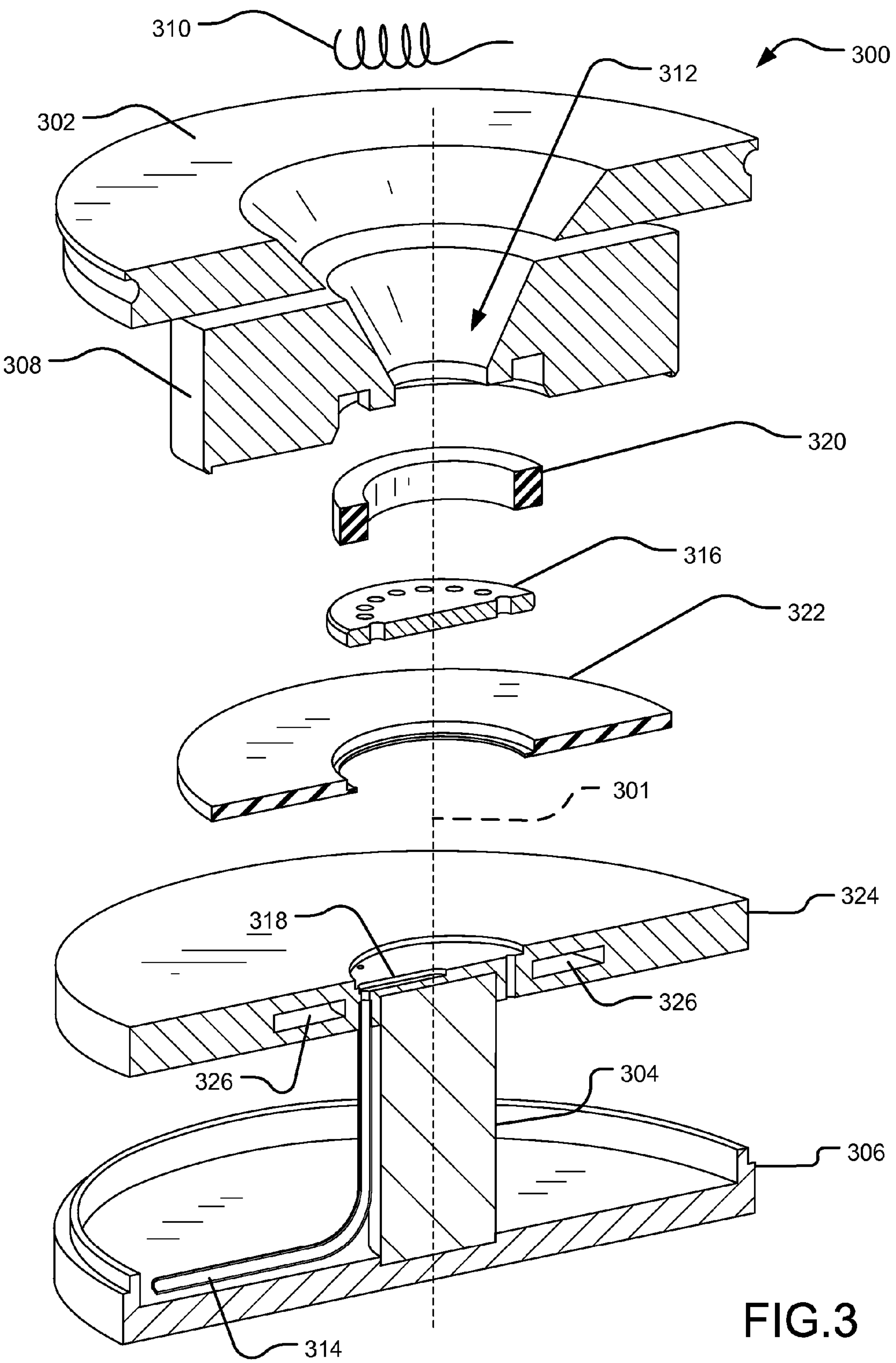
FIG. 3 illustrates an exploded cross-sectional view of an exemplary fluid-cooled ion source.

FIG. 3 illustrates an exploded cross-sectional view of an exemplary fluid-cooled ion source 300. The positions of the ion source components are described herein relative to an axis 301. A magnetically permeable pole piece 302 is coupled to a magnet 304 via a magnetically permeable base 306 and magnetically permeable sidewall (not shown). A cathode 310 is positioned outside the output of the ion source 300 to produce electrons that maintain the discharge and neutralize the ion beam emanating from the ion source 300.

A duct 314 allows a working gas to be fed through an outlet 318 and a gas distributor 316 to the ionization region 312 of the ion source 300. The gas distributor 316 is electrically isolated from the anode 308 by the insulator 320 and from the cooling plate 324 by the thermal transfer interface component 322.

An anode 308 is spaced apart from the pole piece 302 by one or more insulating spacers (not shown). In a typical configuration, the anode 308 is set to a positive electrical potential, and the pole piece 302, the base 306, the sidewall, the cathode 310 and the magnet are grounded, although alternative voltage relationships are contemplated.

A cooling plate 324 is positioned between the anode 308 and the magnet 304 to draw heat from the anode 308 and therefore thermally protect the magnet 304. The cooling plate 324 includes a coolant cavity 326 through which coolant (e.g., a liquid or gas) can flow. In the cooling plate 324 of FIG. 3, the coolant cavity 326 forms a channel positioned near the interior circumference of the doughnut-shaped cooling plate 324, although other cavity sizes and configurations are contemplated in alternative implementations. Coolant lines (not shown) are coupled to the cooling plate 324 to provide a flow of coolant through the coolant cavity 326 of the cooling plate 324.

In one implementation, the cooling plate 324, the magnet 304, the base 306, and the duct 314 are combined in one subassembly (an exemplary "base subassembly"), and the pole piece 302, the anode 308, the insulator 320, the gas distributor 316, and the thermal transfer interface component 322 are combined in a second subassembly (an exemplary "anode subassembly"). During maintenance, the anode subassembly may be separated intact from the base subassembly without having to disassemble the cooling plate 324 and associated coolant lines.

Figure 4:
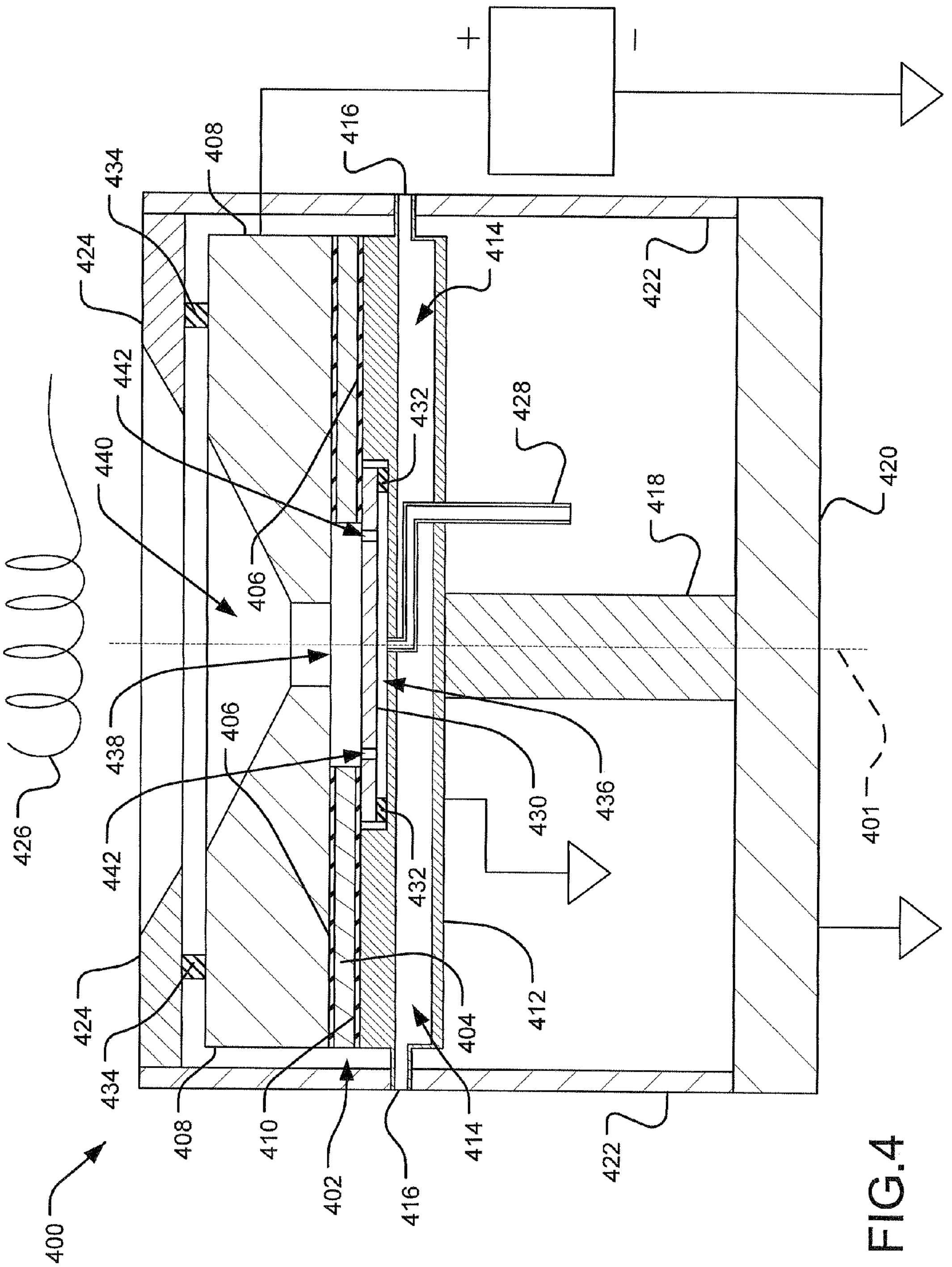
FIG. 4 illustrates a schematic of an exemplary fluid-cooled ion source.

FIG. 4 illustrates a schematic of an exemplary fluid-cooled ion source 400. The positions of the ion source components are described herein relative to an axis 401. The ion source 400 has similar structure to the ion sources described with regard to FIGS. 2-3. Of particular interest in the implementation shown in FIG. 4 is the structure of the thermal transfer interface component 402, which is formed from a metal plate 404 having a first coating 406 of a thermally conductive, electrically insulating material on the plate surface that is in thermally conductive contact with the anode 408 and a second coating 410 of the thermally conductive, electrically insulating material on the plate surface that is in thermally conductive contact with the cooling plate 412. In one implementation, the thermally conductive, electrically insulating material (e.g., aluminum oxide) is sprayed on the thermal transfer interface component 402 to coat each surface. In an alternative implementation, only one of the metal plate surfaces is so coated. In either implementation, the anode 408 is in thermally conductive contact with the cooling plate 412.

Note that the cooling plate 412 is constructed to form a coolant cavity 414. As such, coolant (e.g., a liquid or gas) can flow through coolant lines 416 and the coolant cavity 414 to absorb heat from the anode 408.

Other components of the ion source include a magnet 418, a base 420, a sidewall 422, a pole piece 424, a cathode 426, a gas duct 428, a gas distributor 430, insulators 432, and insulating spacers 434. The anode 408 is set at a positive electrical potential (e.g., without limitation 75-300 volts), and the pole piece 424, magnet 418, cooling plate 412, base 420, and sidewall 422 are grounded. By virtue of the insulators 432 and the electrically insulating material on the thermal transfer interface component 402, the gas distributor 430 floats electrically. Also by virtue of the assembly, a contained gas distribution plenum 436 is produced behind the gas distributor 430 that is bounded entirely or in part by the cooling plate 412, the insulators 432, and the gas distributor 430. The arrangement is advantageous in that the gas paths 442 through the gas distributor 430 to the ionization region 440 are directed to the bottom opening 438 of the anode 408 and, thereby, improves overall gas utilization.

Figure 5:
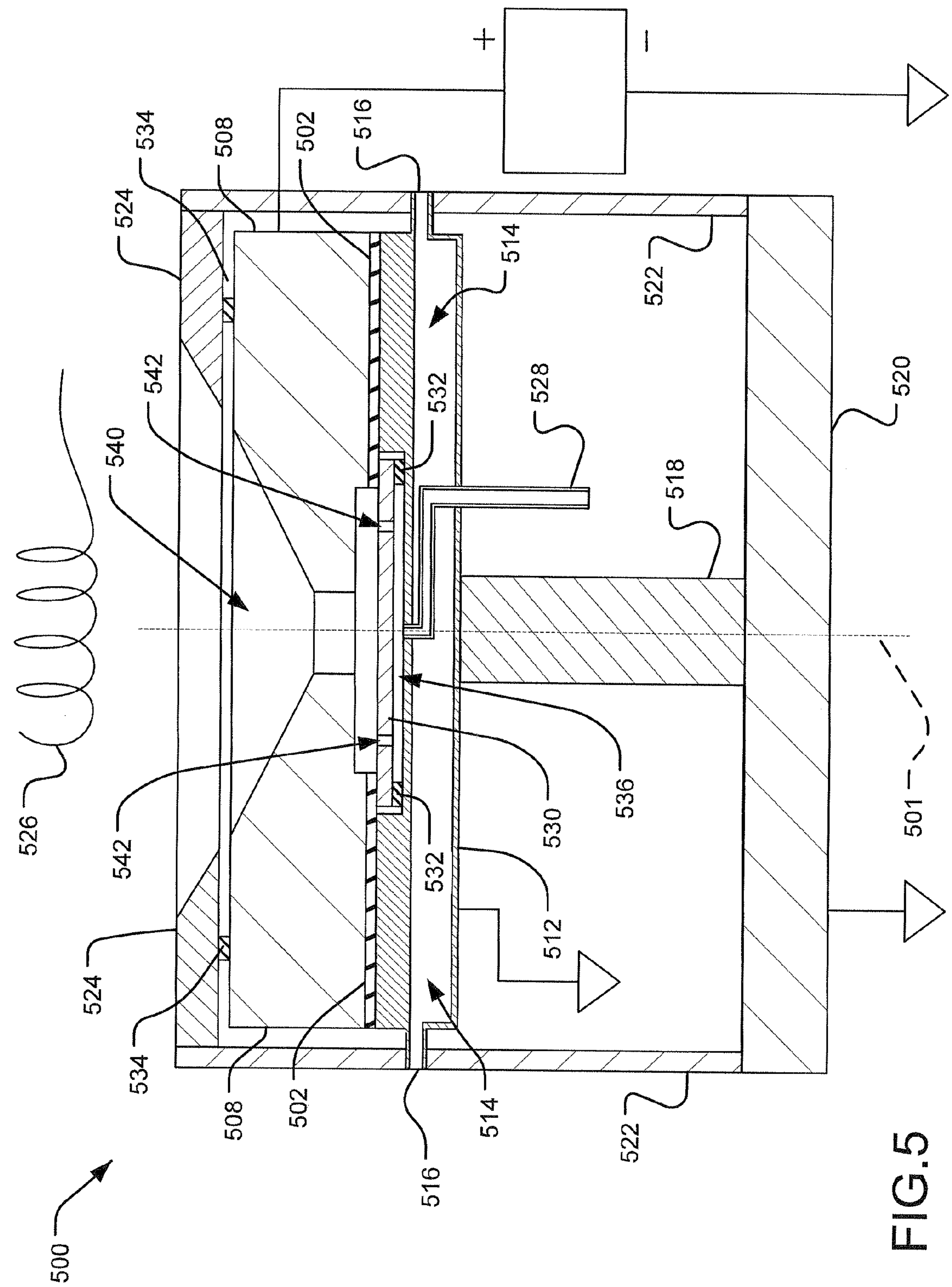
FIG. 5 illustrates a schematic of another exemplary fluid-cooled ion source.

FIG. 5 illustrates a schematic of another exemplary fluid-cooled ion source 500. The positions of the ion source components are described herein relative to an axis 501. The ion source 500 has similar structure to the ion sources described with regard to FIGS. 2-4. Of particular interest in the implementation shown in FIG. 5 is the structure of the thermal transfer interface component 502, which is formed from a coating of a thermally conductive, electrically insulating material to provide thermally conductive, electrically insulating contact between the anode 508 and the cooling plate 512. In one implementation, the thermally conductive, electrically insulating material is sprayed on the anode 508 to coat its bottom surface. In an alternative implementation, the thermally conductive, electrically insulating material is sprayed on the cooling plate 512 to coat its upper surface.

Note that the cooling plate 512 is constructed to form a coolant cavity 514. As such, coolant (e.g., a liquid or gas) can flow through coolant lines 516 and the coolant cavity 514 to absorb heat from the anode 508.

Other components of the ion source include a magnet 518, a base 520, a sidewall 522, a pole piece 524, a cathode 526, a gas duct 528, a gas distributor 530, insulators 532, and insulating spacers 534. The anode 508 is set at a positive electrical potential (e.g., without limitation 75-300 volts), and the pole piece 524, magnet 518, cooling plate 512, base 520, and sidewall 522 are grounded. By virtue of the insulators 532 and the electrically insulating material on the thermal transfer interface component 502, the gas distributor 530 floats electrically. Also by virtue of the assembly, a contained gas distribution plenum 536 is produced behind the gas distributor 530 that is bounded entirely or in part by the cooling plate 512, the insulators 532, and the gas distributor 530. The arrangement is advantageous in that the gas paths 542 through the gas distributor 530 to the ionization region 540 are directed to the bottom opening 538 of the anode 508 and, thereby, improves overall gas utilization.

Figure 6:
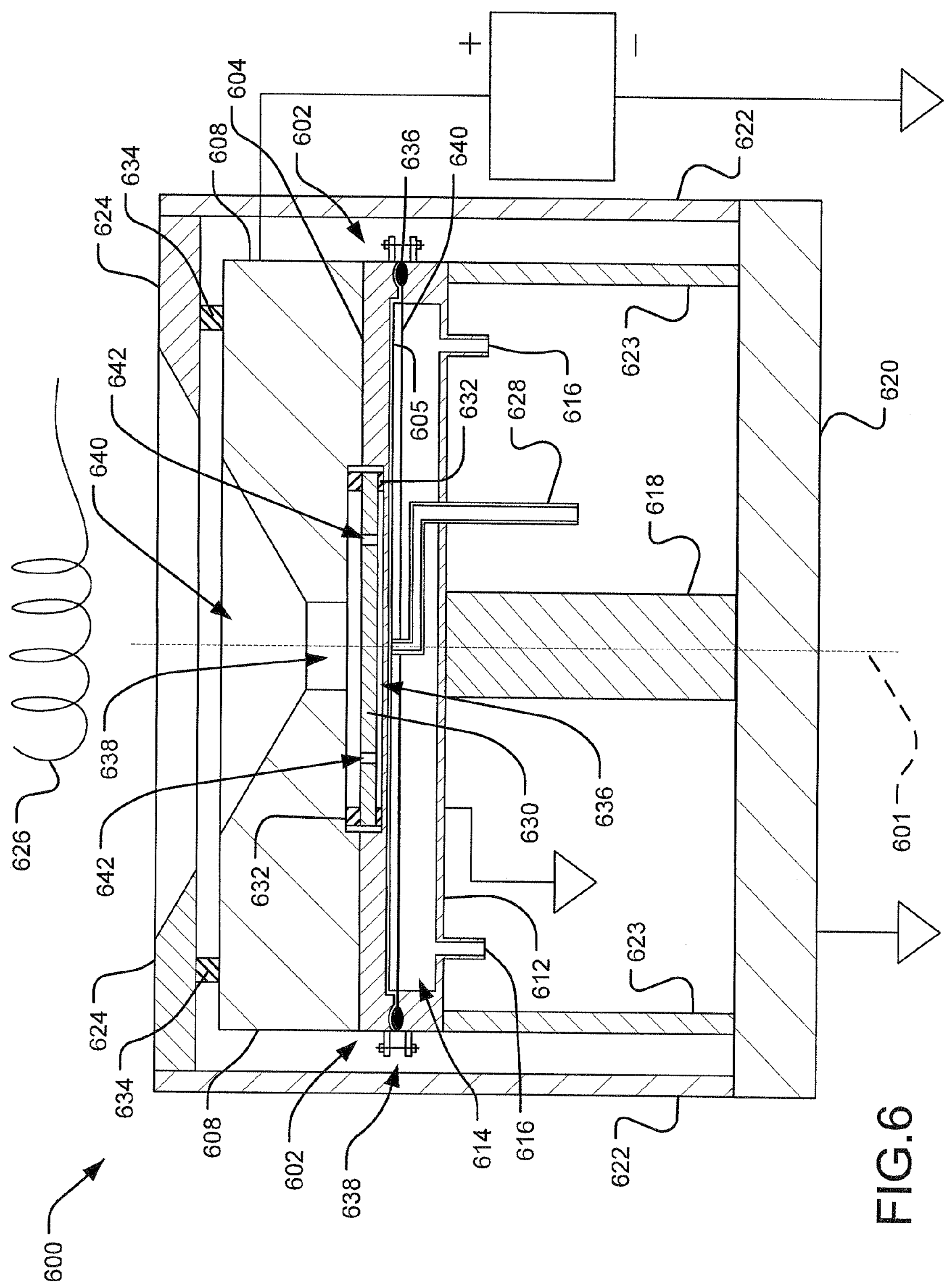
FIG. 6 illustrates a schematic of yet another exemplary fluid-cooled ion source.

FIG. 6 illustrates a schematic of yet another exemplary fluid-cooled ion source 600. The positions of the ion source components are described herein relative to an axis 601. The ion source 600 has similar structure to the ion sources described with regard to FIGS. 2-5. Of particular interest in the implementation shown in FIG. 6 is the structure of the thermal transfer interface component 602, which is formed from a thermal control plate 604 having a coating 605 of a thermally conductive, electrically insulating material on the plate surface. The combination of the thermal control plate 604 and the coating 605 provides a thermally conductive, electrically insulating interface component between the anode 608 and the coolant contained in a coolant cavity 614, which is formed by a cooling plate 612 and thermal control plate 604. As such, the anode 608 and the cooling plate 612 are in thermally conductive contact through the thermal transfer interface component 602 and the coolant in the coolant cavity. In one implementation, the thermally conductive, electrically insulating material is sprayed on the bottom surface (i.e., the surface exposed to the coolant cavity 614) of the thermal control plate 604 to facilitate thermal conduction and to reduce or prevent electrical leakage through the coolant.

Note that the cooling plate 612 is constructed to form the coolant cavity 614, which is sealed against the thermal control plate 604 using an O-ring 636 and one or more clamps 638. The clamps 638 are insulated to prevent an electrical short from the thermal control plate 604 to the cooling plate 612. As such, coolant can flow through coolant lines 616 and the coolant cavity 614 to absorb heat from the anode 608. Note, a seam 640 separates the plate 604 and the cooling plate 612, which together contribute to the dimensions of the coolant cavity 614 in the illustrated implementation. However, it should be understood that either the plate 604 or the cooling plate 612 could merely be a flat plate that helps form the cooling cavity 614 but contributes no additional volume to the coolant cavity 614.

Other components of the ion source include a magnet 618, a base 620, a sidewall 622, supports 623, a pole piece 624, a cathode 626, a gas duct 628, a gas distributor 630, insulators 632, and insulating spacers 634. The anode 608 and thermal control plate 604 are set at a positive electrical potential (e.g., without limitation 75-300 volts), and the pole piece 624, magnet 618, cooling plate 612, base 620, and sidewall 622 are grounded. A thermally conductive material (e.g., graphite foil or a thermally conductive elastomer sheet) may be positioned between the anode 608 and the thermal control plate 604 to enhance heat transfer to the coolant. The gas distributor 630 floats electrically. Also by virtue of the assembly, a contained gas distribution plenum 636 is produced behind the gas distributor 630 that is bounded entirely or in part by the thermal control plate 604, the insulators 632, and the gas distributor 630. The arrangement is advantageous in that the gas paths 642 through the gas distributor 630 to the ionization region 640 are directed to the bottom opening 638 of the anode 608 and, thereby, improves overall gas utilization.

Figure 7:
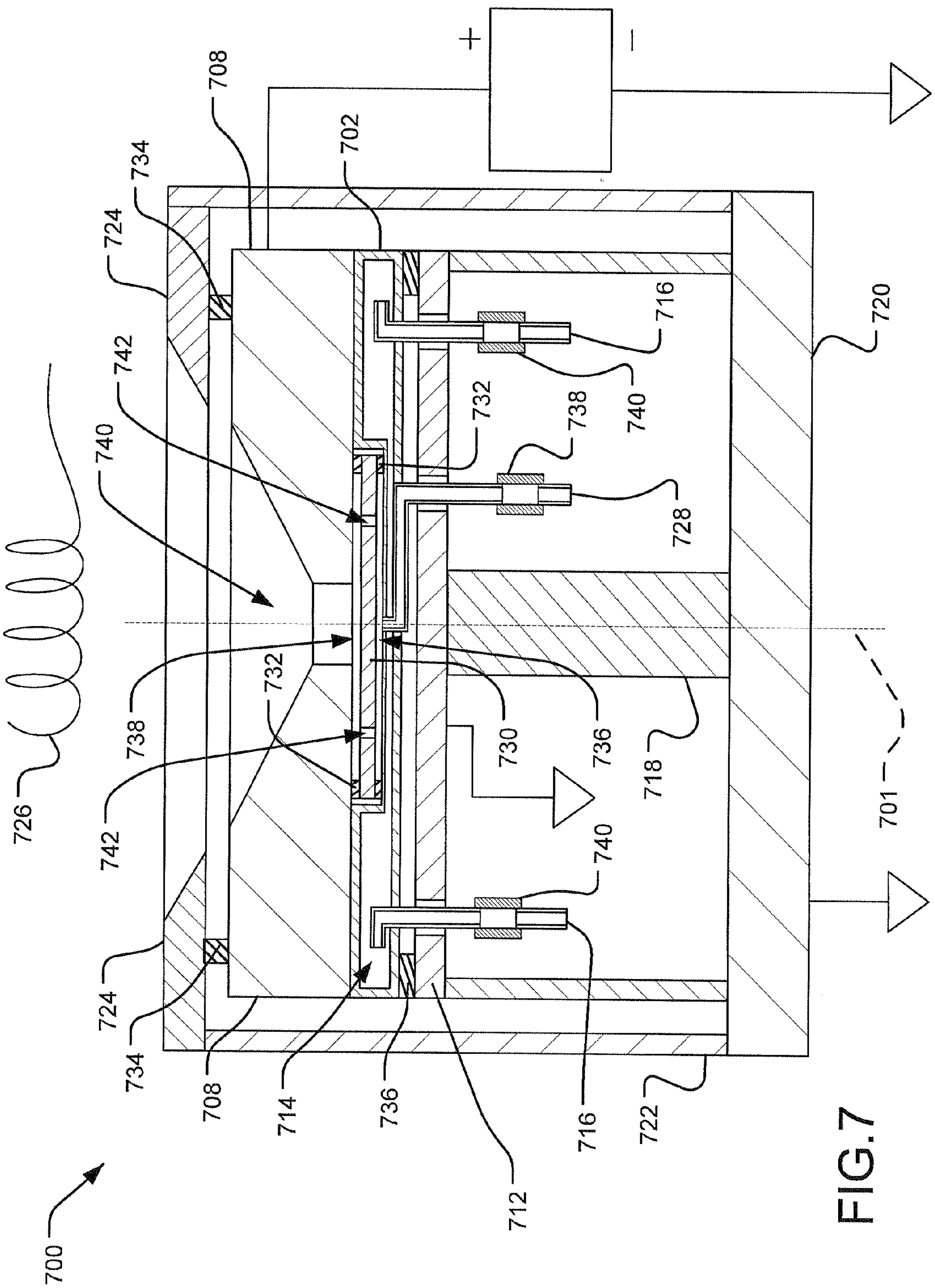
FIG. 7 illustrates a schematic of yet another exemplary fluid-cooled ion source.

FIG. 7 illustrates a schematic of yet another exemplary fluid-cooled ion source 700. The positions of the ion source components are described herein relative to an axis 701. The ion source 700 has similar structure to the ion sources described with regard to FIGS. 2-6. Of particular interest in the implementation shown in FIG. 7 is the structure of the cooling plate 702, which is not electrically insulated from the anode 708. Instead, the cooling plate 702 is insulated from substantially the rest of the ion source 700 by insulators, including insulating spacers 734, insulators 732, and insulators 736. The gas duct 728 and the water lines 716 are electrically isolated by isolators, 738 and 740, respectively. As such, the anode 708 and the cooling plate 702 are at a positive electrical potential, the gas distributor 730 is floating electrically, and most of the other components of the ion source 700 are grounded. A thermally conductive material (e.g., graphite foil or a thermally conductive elastomer sheet) may be positioned between the anode 708 and the cooling plate 702 to enhance heat transfer to the coolant. By virtue of the assembly, a contained gas distribution plenum 736 is produced behind the gas distributor 730 that is bounded entirely or in part by the thermal control plate 702, the insulators 732, and the gas distributor 730. The arrangement is advantageous in that the gas paths 742 to the ionization region 740 through the gas distributor 730 are directed to the bottom opening 738 of the anode 708 and, thereby, improves overall gas utilization.

Note that the cooling plate 702 forms a coolant cavity 714, such that coolant can flow through coolant lines 716 and the coolant cavity 714 to absorb heat from the anode 708. Other components of the ion source include a magnet 718, a base 720, a sidewall 722, a pole piece 724, a cathode 726, a gas duct 728, a gas distributor 730, insulators 732, and spacers 734.

Figure 8:
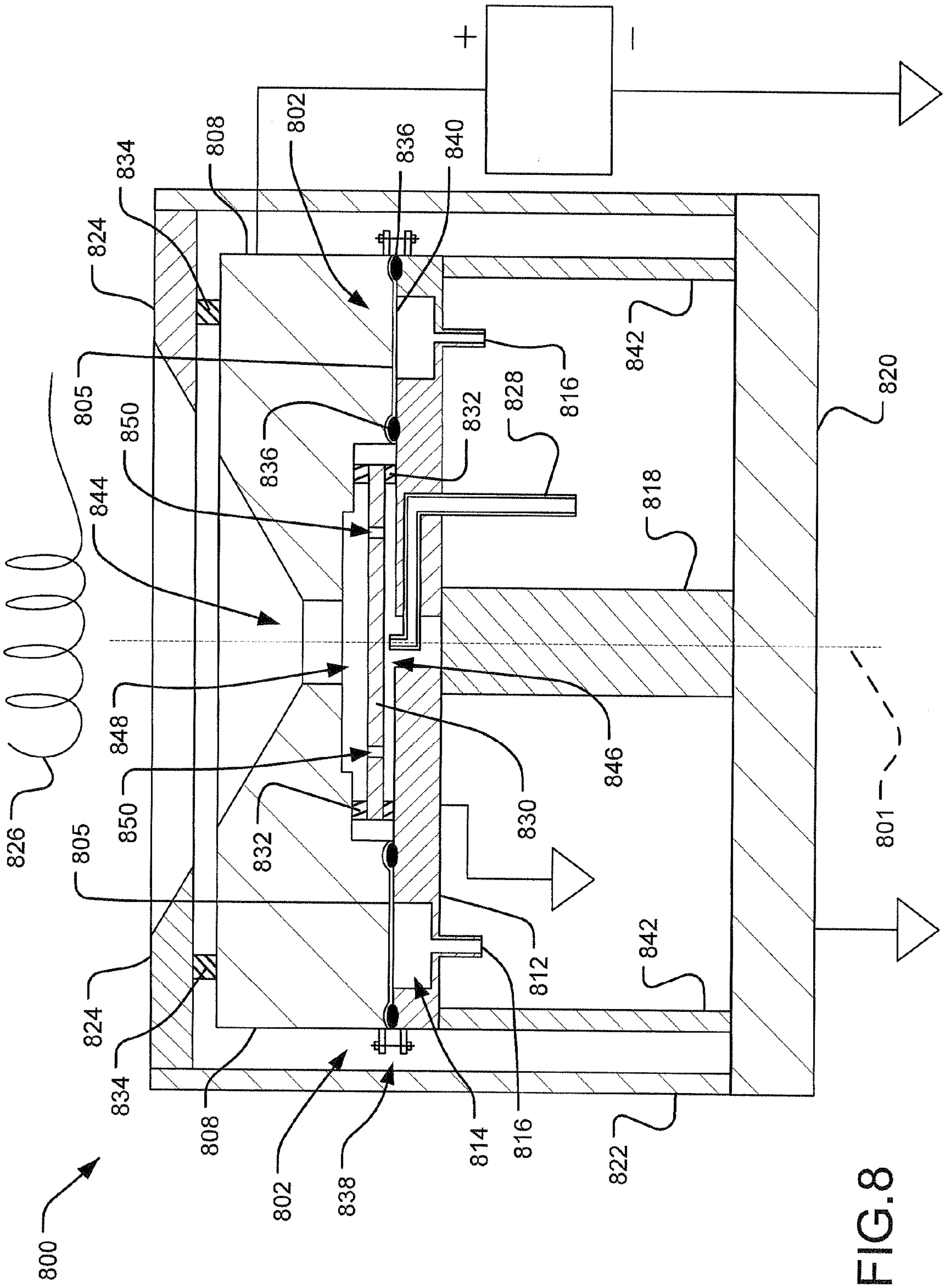
FIG. 8 illustrates a schematic of yet another exemplary fluid-cooled ion source.

FIG. 8 illustrates a schematic of yet another exemplary fluid-cooled ion source 800. The positions of the ion source components are described herein relative to an axis 801. The ion source 800 has similar structure to the ion sources described with regard to FIGS. 2-7. Of particular interest in the implementation shown in FIG. 8 is the structure of the thermal transfer interface component 802, which is formed from the bottom surface of the anode 808 having a coating 805 of a thermally conductive, electrically insulating material on the anode surface. The combination of the bottom surface of the anode 808 and the coating 805 provides a thermally conductive, electrically insulating interface component between the anode 808 and the coolant contained in a coolant cavity 814, wherein the coolant cavity 814 is formed by a cooling plate 812 and the anode 808. In one implementation, the thermally conductive, electrically insulating material is sprayed on the bottom surface (i.e., the surface exposed to the coolant cavity 814) of the anode 808. In the illustrated implementation, the anode 808 and the cooling plate 812 are in thermally conductive contact through the coating 805 and the coolant.

Note that the cooling plate 812 is constructed to form the coolant cavity 814, which is sealed against the anode 808 using O-rings 836 and one or more clamps 838 which are insulated to prevent an electrical short from the thermal transfer interface component 802 to the cooling plate 812. As such, coolant can flow through coolant lines 816 and the coolant cavity 814 to absorb heat from the anode 808. Note: A seam 840 separates the anode 808 and the cooling plate 812, which together contribute to the dimensions of the coolant cavity 814 in the illustrated implementation. However, it should be understood that either the anode surface could merely be flat or the cooling plate 812 could merely be a flat plate, such that one component does not contribute additional volume to the coolant cavity 814 but still contribute to forming the cavity, nonetheless.

Other components of the ion source include a magnet 818, a base 820, a sidewall 822, a pole piece 824, a cathode 826, a gas duct 828, a gas distributor 830, insulators 832, supports 842, and insulating spacers 834. The anode 808 is set at a positive electrical potential (e.g., without limitation 75-300 volts), and the pole piece 824, magnet 818, cooling plate 812, base 820, and sidewall 822 are grounded. The gas distributor 830 floats electrically. Again, by virtue of the assembly, a contained gas distribution plenum 846 is produced behind the gas distributor 830 that is bounded entirely or in part by the cooling plate 812, the magnet 818, the insulators 832, and the gas distributor 830. The arrangement is advantageous in that the gas paths 850 through the gas distributor 830 to the ionization region 844 are directed to the bottom opening 848 of the anode 808 and, thereby, improves overall gas utilization.

Figure 9:
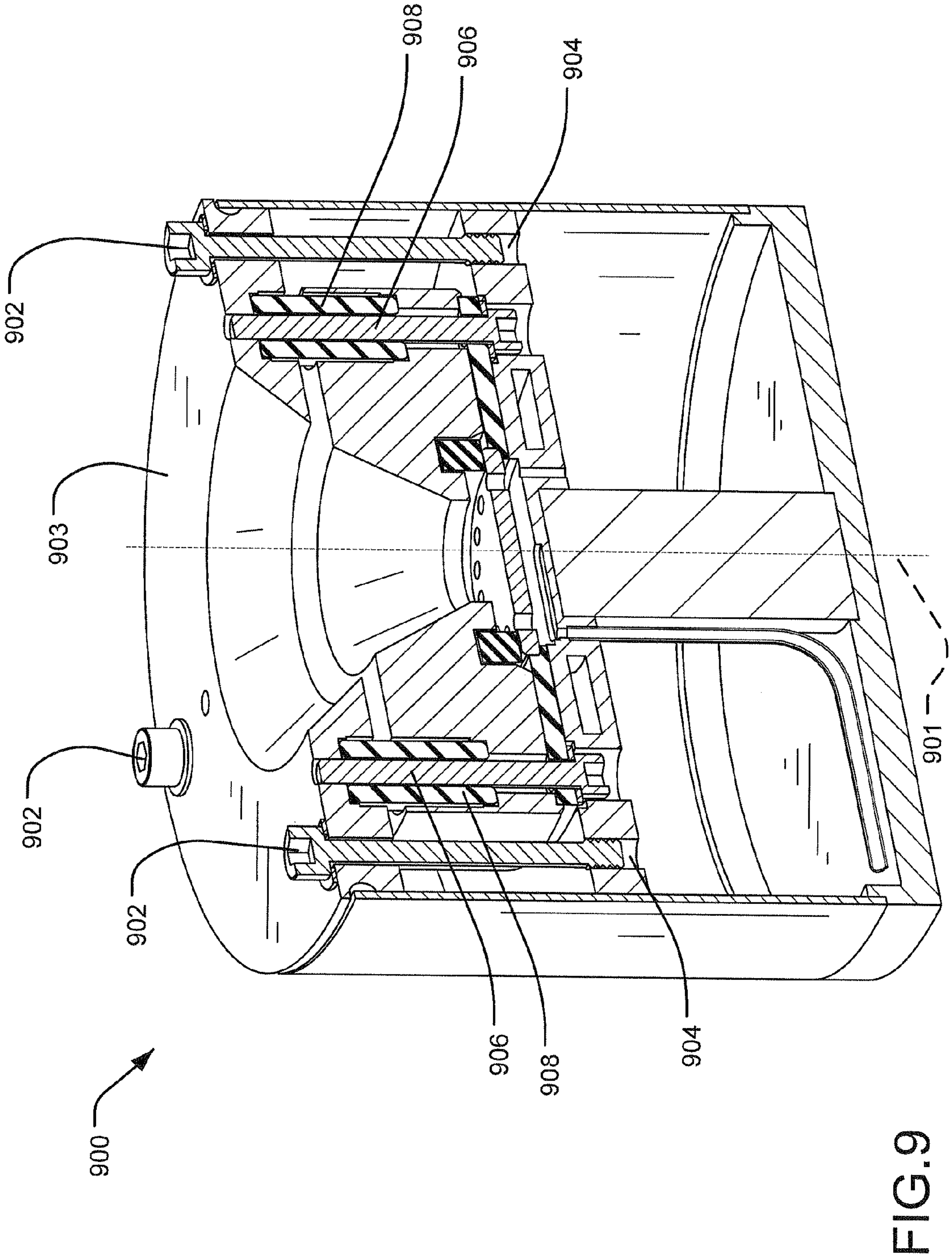
FIG. 9 illustrates a further cross-sectional view of an exemplary fluid-cooled ion source.

FIG. 9 illustrates a cross-sectional view of an exemplary fluid-cooled ion source 900. The positions of the ion source components are described herein relative to an axis 901. The ion source 900 has similar structure to the ion sources described with regard to FIGS. 2-8. Of particular interest in the implementation shown in FIG. 9 is the subassembly structures of the ion source 900, which facilitate disassembly and assembly of the ion source 900.

Specifically, in the illustrated implementation, the ion source 900 includes a pole piece 903 and one or more subassembly attachments 902 (e.g., bolts) that insert into threaded holes 904 and hold an anode subassembly together with a base subassembly. In some implementations, the anode subassembly includes the anode and may also include the pole piece, the thermal transfer interface component, and the gas distributor, although other configurations are also contemplated. Likewise, in some implementations, the base subassembly includes the magnet and the cooling plate and may also include the base, coolant lines, and the gas duct, although other configurations are also contemplated. The sidewalls may be a component of either subassembly or an independent component that may be temporarily removed during disassembly.

In the illustrated implementation, one or more anode subassembly attachments 906 (e.g., bolts) hold the anode subassembly together by being screwed into the pole piece 903 through one or more insulators 908. The subassembly attachments 906 may be removed to disassemble the anode subassembly and to remove the thermal transfer interface component, thereby providing easy access for removal and insertion of the gas distributor.

Figure 10:
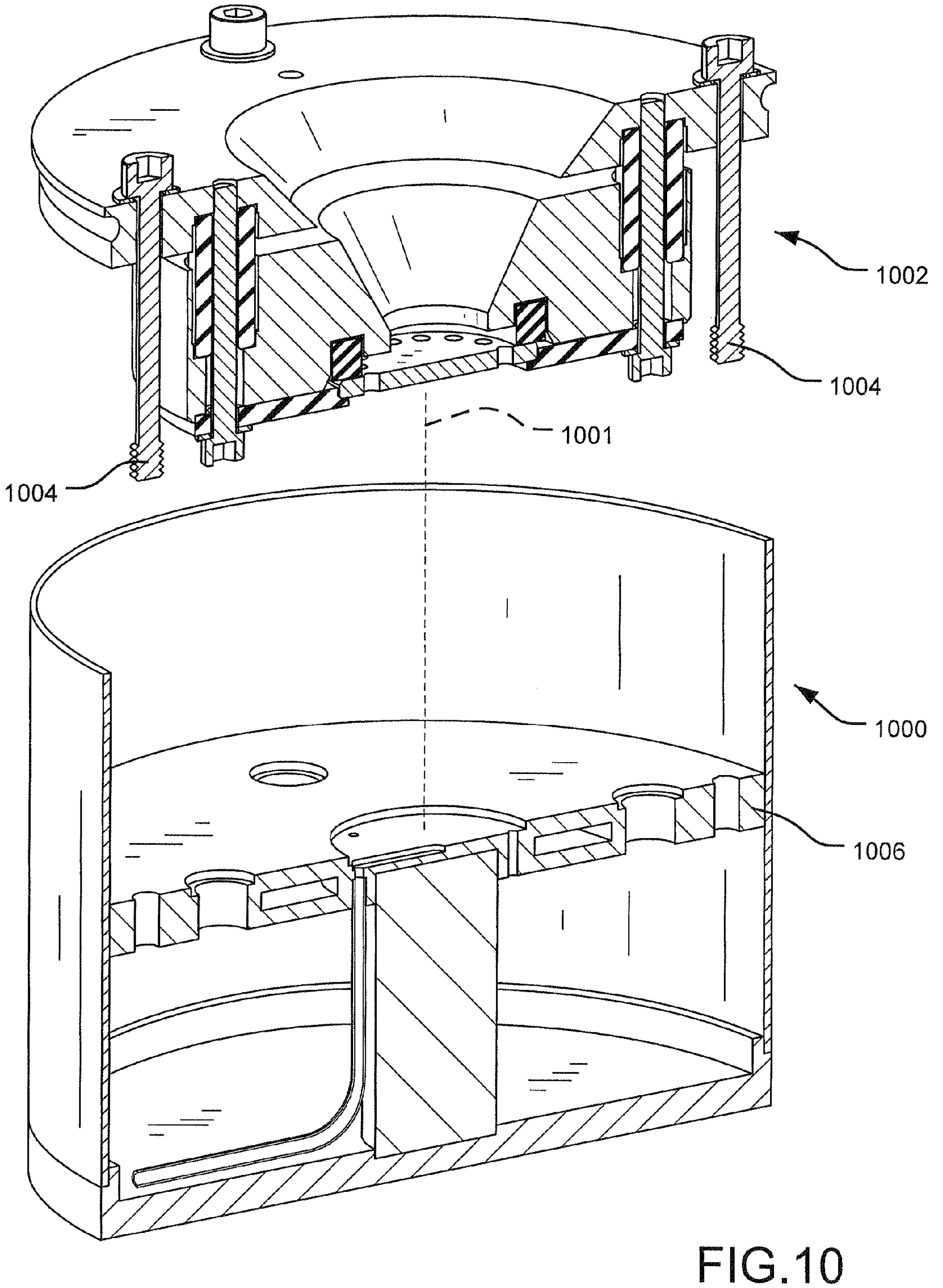
FIG. 10 illustrates an exploded cross-sectional view of an exemplary fluid-cooled ion source.

FIG. 10 illustrates a partially exploded, cross-sectional view of the exemplary fluid-cooled ion source of FIG. 9. The positions of the ion source components are described herein relative to an axis 1001. The base subassembly 1000 has been separated from the anode-subassembly 1002 by unscrewing of the subassembly bolts 1004. In the illustrated implementation, the magnet subassembly 1000 includes the cooling plate 1006.

Figure 11:
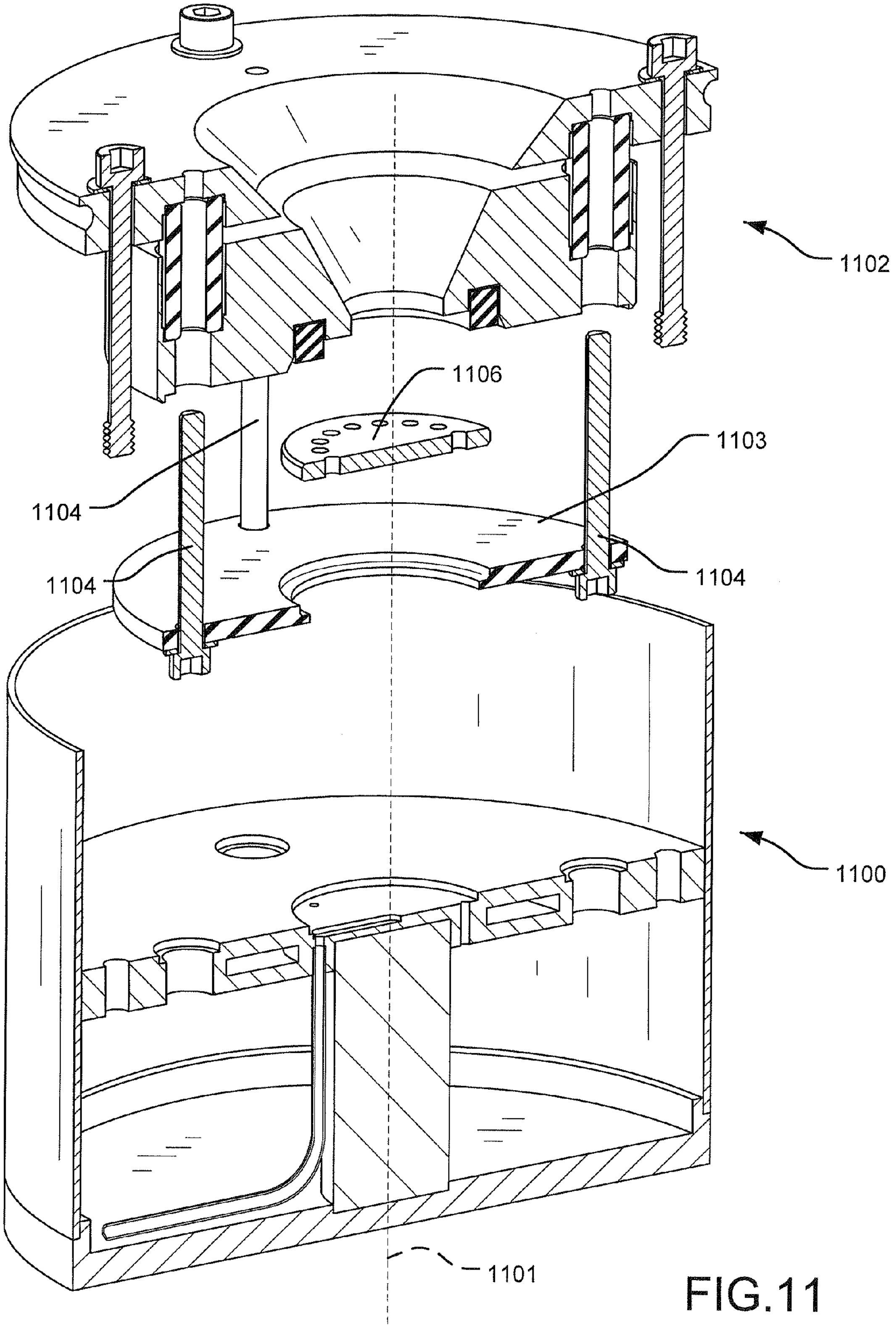
FIG. 11 illustrates an exploded cross-sectional view of an exemplary fluid-cooled ion source.

FIG. 11 illustrates a further exploded, cross-sectional view of the exemplary fluid-cooled ion source of FIG. 9. The positions of the ion source components are described herein relative to an axis 1101. A base subassembly 1100 has been separated from an anode subassembly 1102 (as described with regard to FIG. 10), and a thermal transfer interface component 1103 has been separated from the rest of the anode subassembly 1102 by unscrewing of the anode subassembly bolts 1104, thereby providing access to the gas distributor 1106 for maintenance.

Figure 12:
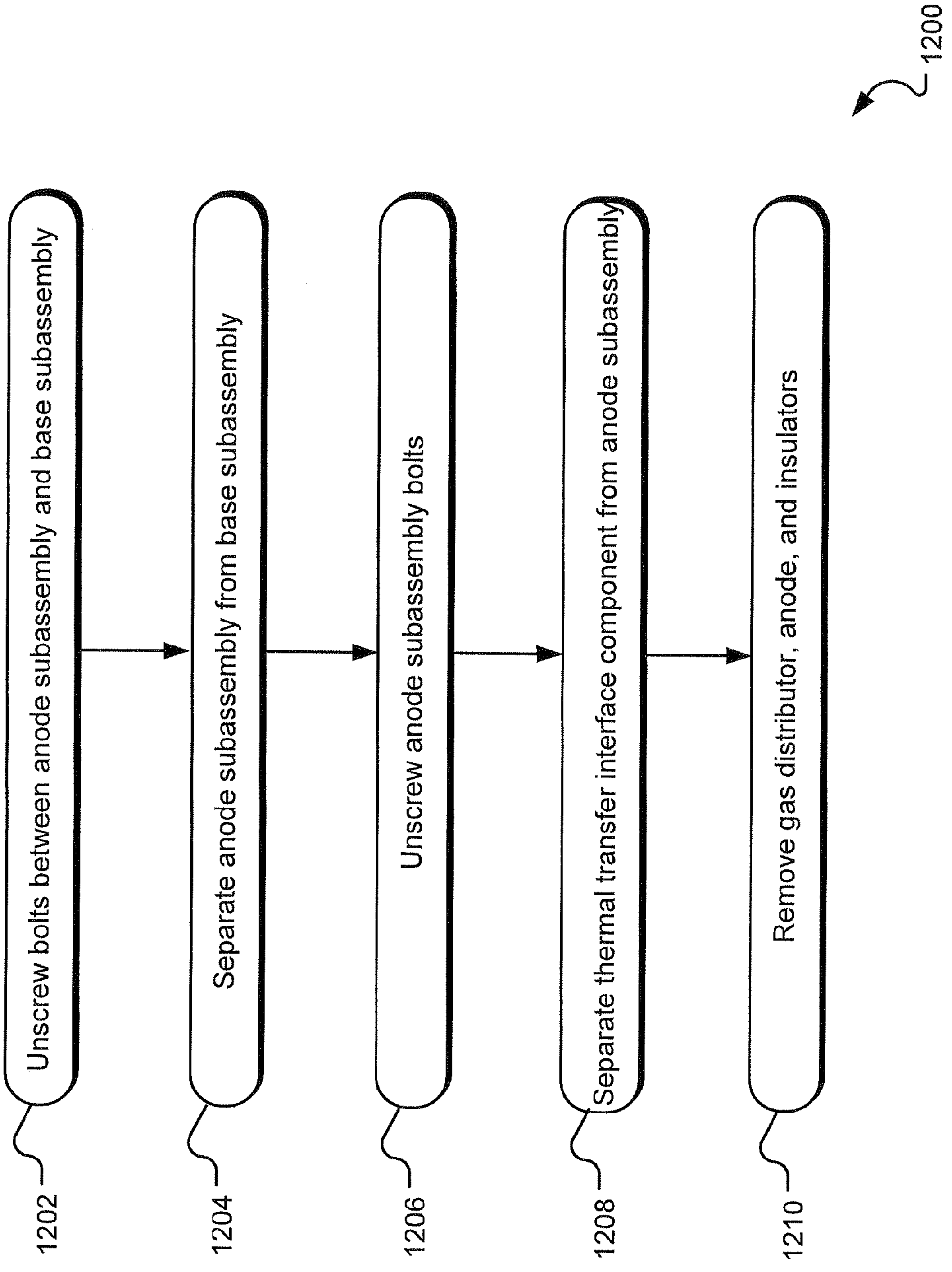
FIG. 12 depicts operations for disassembling an exemplary fluid-cooled ion source.

FIG. 12 depicts operations 1200 for disassembling an exemplary fluid-cooled ion source. A detaching operation 1202 unscrews one or more subassembly bolts that hold an anode subassembly together with a base subassembly. A magnet and a cooling plate reside in the base subassembly. The subassembly bolts in one implementation extend from the pole piece through the anode into threaded holes in the cooling plate, although other configurations are contemplated. A separation operation 1204 separates the anode subassembly from the magnet subassembly, as exemplified in FIG. 10.

In the illustrated implementation, another detaching operation 1206 unscrews one or more anode subassembly bolts that hold the thermal transfer interface component against the anode. A separation operation 1208 separates the thermal transfer interface component from the anode to provide access to the gas distributor. In alternative implementations, however, the gas distributor lies beneath the thermal transfer interface components along a central axis and is therefore exposed to access merely by the removal of the anode subassembly. As such, detaching operation 1206 and the separation operation 1208 may be omitted in some implementations. In a maintenance operation 1210, the gas distributor is removed from the anode subassembly, and the anode and insulators are disassembled for maintenance.

Figure 13:
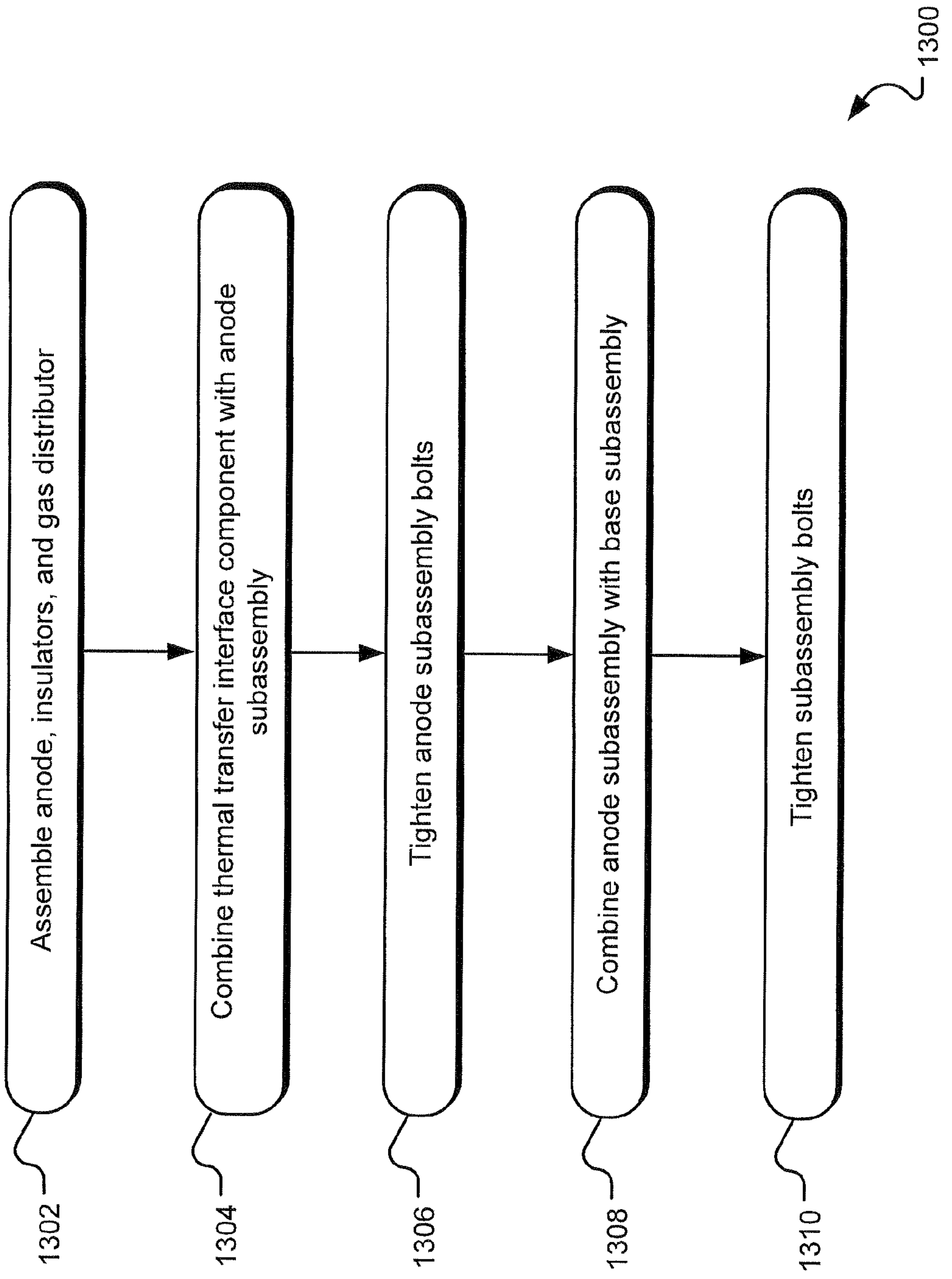
FIG. 13 depicts operations for assembling an exemplary fluid-cooled ion source.

FIG. 13 depicts operations 1300 for assembling an exemplary fluid-cooled ion source. A maintenance operation 1302 combines the insulators, anode, and gas distributor into the anode subassembly. In the illustrated implementation, a combination operation 1304 combines the thermal transfer interface component with the anode to hold the gas distributor in the anode subassembly. An attaching operation 1306 screws one or more anode subassembly bolts to hold the thermal transfer interface component against the anode. In alternative implementations, however, the gas distributor lies beneath the thermal transfer interface components along a central axis and is therefore exposed to access merely by the removal of the anode subassembly. As such, the combination operation 1305 and the attaching operation 1306 may be omitted in some implementations.

A combination operation 1308 combines the anode subassembly with the magnet subassembly. A magnet and a cooling plate reside in the base subassembly. An attaching operation 1310 screws one or more subassembly bolts to hold an anode subassembly together with a base subassembly. The subassembly bolts in one implementation extend from the pole piece through the anode into threaded hole in the cooling plate, although other configurations are contemplated.

Figure 14:
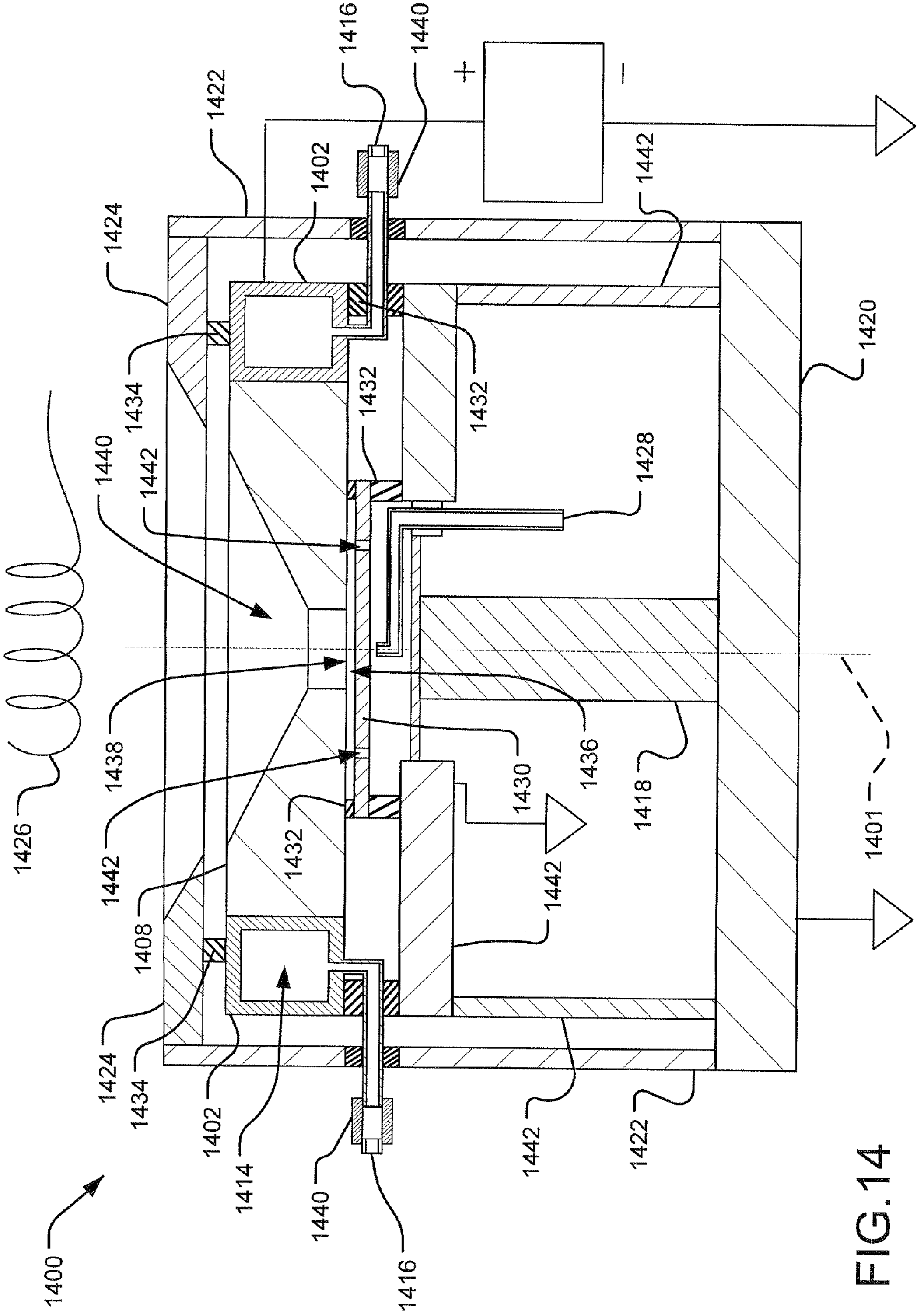
FIG. 14 depicts a schematic of yet another exemplary fluid-cooled ion source.

FIG. 14 depicts a schematic of yet another exemplary fluid-cooled ion source 1400. The positions of the ion source components are described herein relative to an axis 1401. The ion source 1400 has similar structure to the ion sources described with regard to FIGS. 2-11. Of particular interest in the implementation shown in FIG. 14 is the structure of the cooling plate 1402, which is in thermally conductive contact with the anode 1408. One advantage to the implementation shown in FIG. 14 is that the anode 1408 expands to a larger diameter as it heats. Therefore, the thermally conductive contact between the cooling plate 1402 and the anode 1408 tends to improve under the expansive pressure of the anode 1408. It should be understood that the contact interface between the cooling plate 1402 and the anode 1408 need not necessarily be planar and parallel to the axis 1401. Other interface shapes (e.g., an interlocking interface with multiple thermally conductive contact services at different orientations) are also contemplated.

Note that the cooling plate 1402 is constructed to form the coolant cavity 1414. As such, coolant can flow through coolant lines 1416 and the coolant cavity 1414 to absorb heat from the anode 1408. In an alternative implementation, the interior side of the cooling plate 1402 can be replaced with the outside surface of the anode 1408, in combination with an O-ring that seals the anode 1408 and the cooling plate 1402 to form the cooling cavity 1414 (similar to the structure in FIG. 8).

Other components of the ion source include a magnet 1418, a base 1420, a sidewall 1422, a pole piece 1424, a cathode 1426, a gas duct 1428, a gas distributor 1430, insulators 1432, supports 1442, and insulating spacers 1434. The anode 1408 and the cooling plate 1402 are set at a positive electrical potential (e.g., without limitation 75-300 volts), and the pole piece 1424, magnet 1418, base 1420, and sidewall 1422 are grounded. The gas distributor 1430 is insulated and therefore floats electrically. By virtue of the assembly, a contained gas distribution plenum 1436 is produced behind the gas distributor 1430 that is bounded entirely or in part by the cooling plate 1412, the insulators 1432, and the gas distributor 1430 such that the input gas flowing through the gas paths 1442 in the gas distributor 1430 is injected into the center bottom opening 1438 of the anode 1408 to enter the ionization region 1440.

In the illustrated implementation, the cooling plate 1402 is in electrical contact with the anode 1408 and is therefore at the same electrical potential as the anode 1408. As such, the coolant lines 1416 are isolated from the positive electrical potential of the cooling plate 1402 by isolators 1440. In an alternative implementation, a thermally conductive thermal transfer interface component (not shown) may be placed between the cooling plate 1402 and the anode 1408 to facilitate heat transfer. If the thermal transfer interface component is an electrically conductive material (such as graphite foil or a thermally conductive elastomer sheet), the cooling plate 1402 will be at the same electrical potential as the anode 1408. Alternatively, if the thermal transfer interface component is an electrically insulating material (such as boron nitride, aluminum nitride, or a boron nitride/aluminum nitride composite material), the cooling plate 1402 is electrically insulated from the electrical potential on the anode 1408. As such, the cooling plate 1402 may be grounded and isolators 1440 are not required. In either case, whether the cooling plate 1402 and the anode 1402 are in direct physical contact or there exists a thermal transfer interface component between them (whether electrically conducting or insulating), they are still in thermally conductive contact because heat is conducted from the anode 1408 to the cooling plate 1402.

Figure 15:
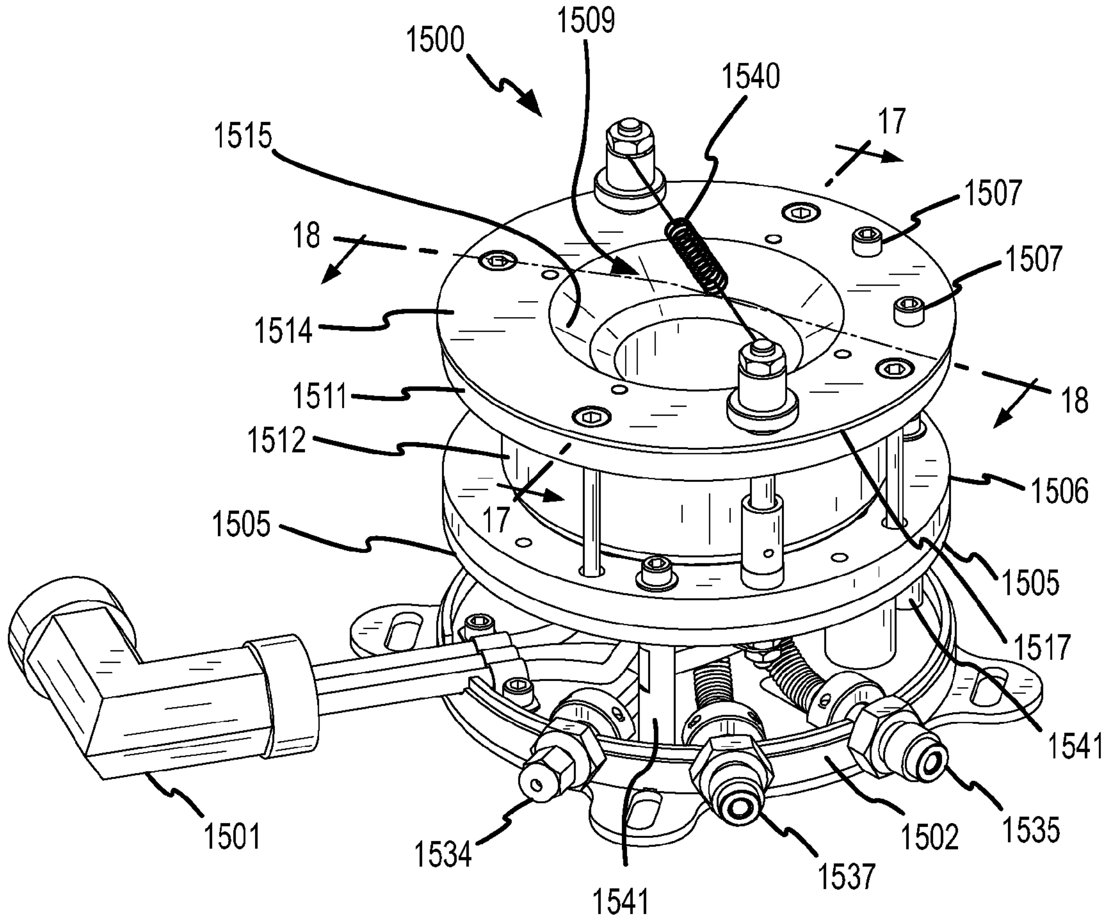
FIG. 15 is an isometric view of a further implementation of a high power ion source with a removable anode assembly.
Figure 16:
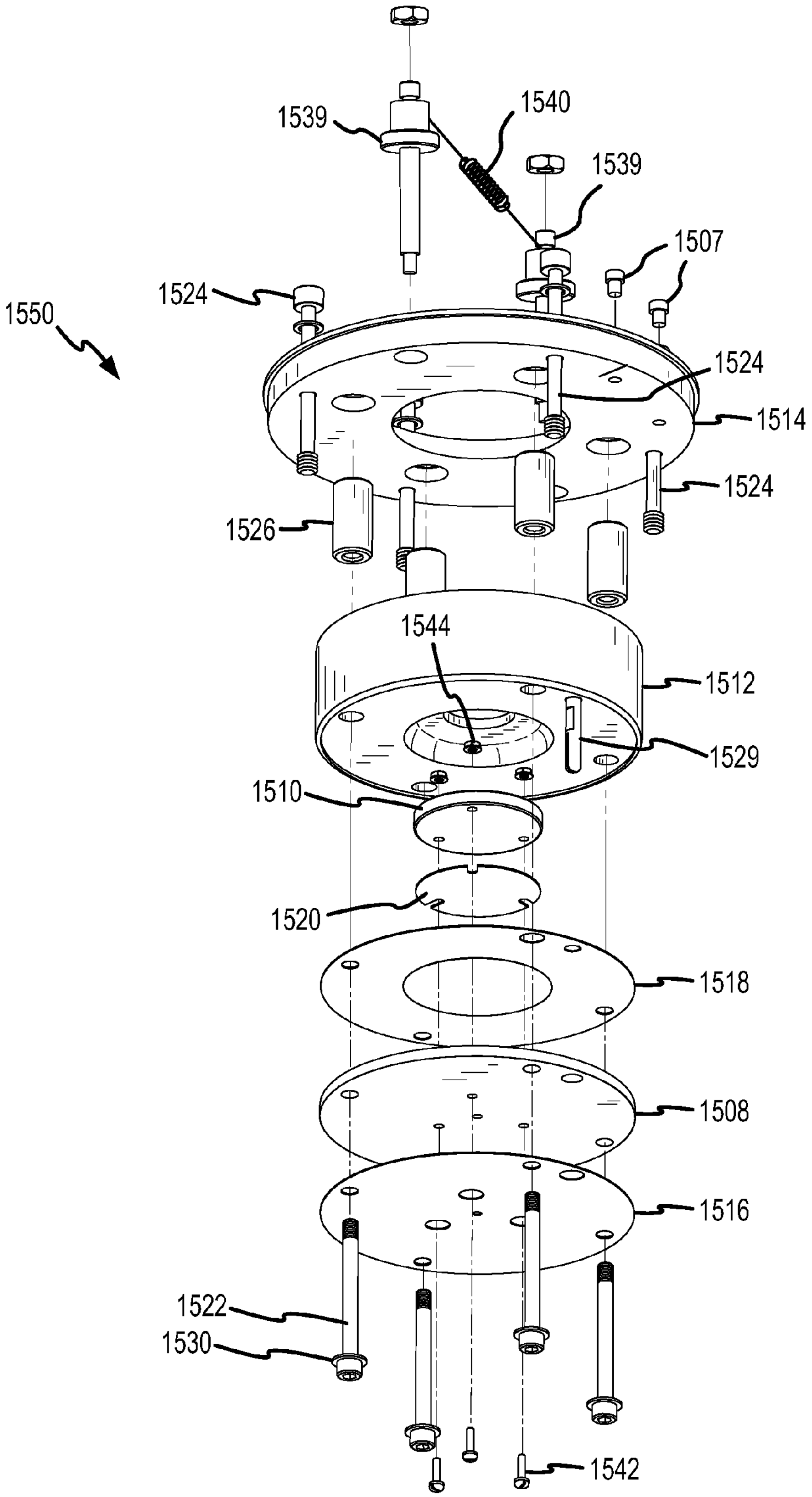
FIG. 16 is an exploded isometric view of the anode assembly of the high power ion source of FIG. 15.
Figure 17:
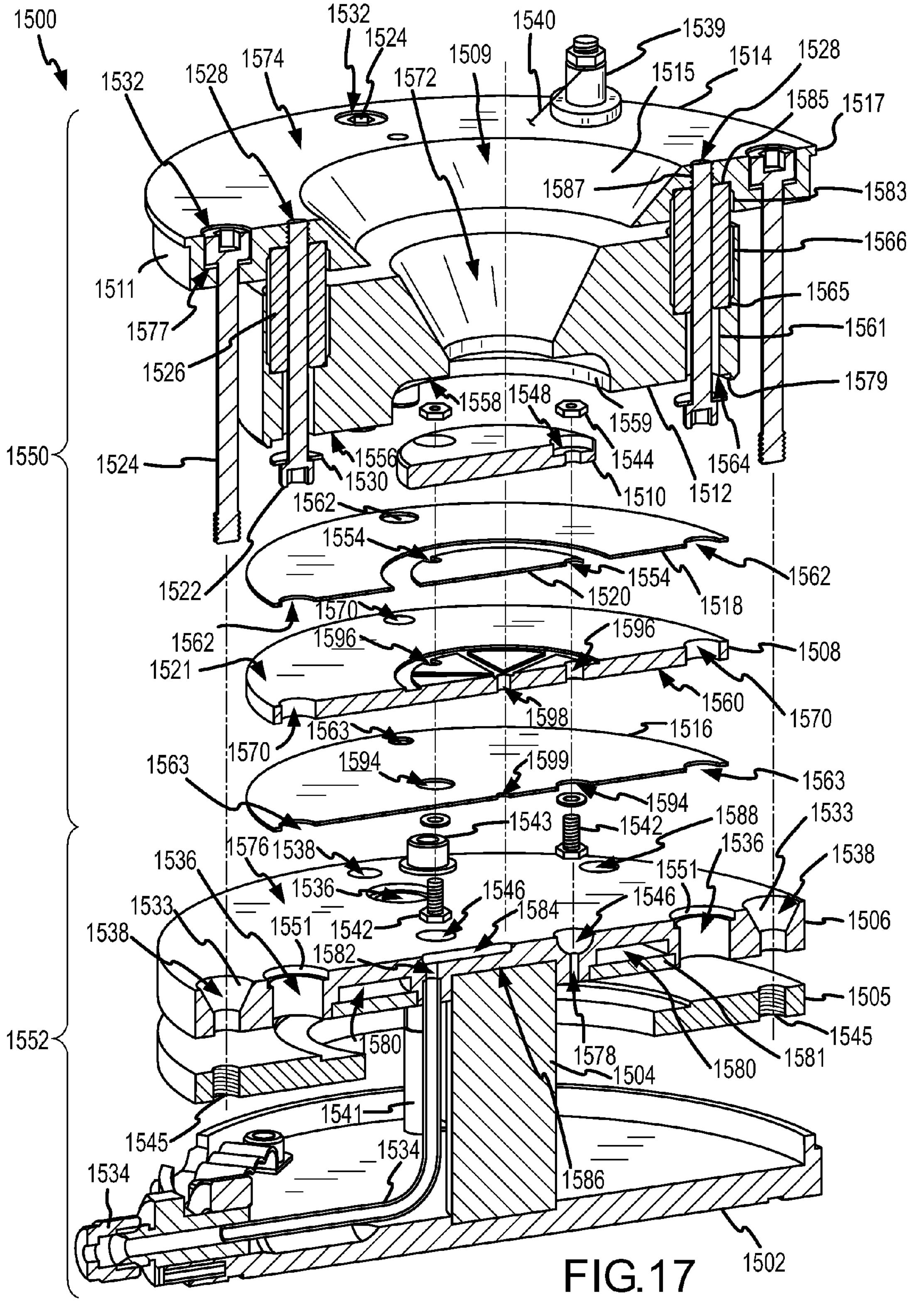
FIG. 17 is an exploded isometric view of the high power ion source of FIG. 15 in cross section as indicated in FIG. 15.
Figure 18:
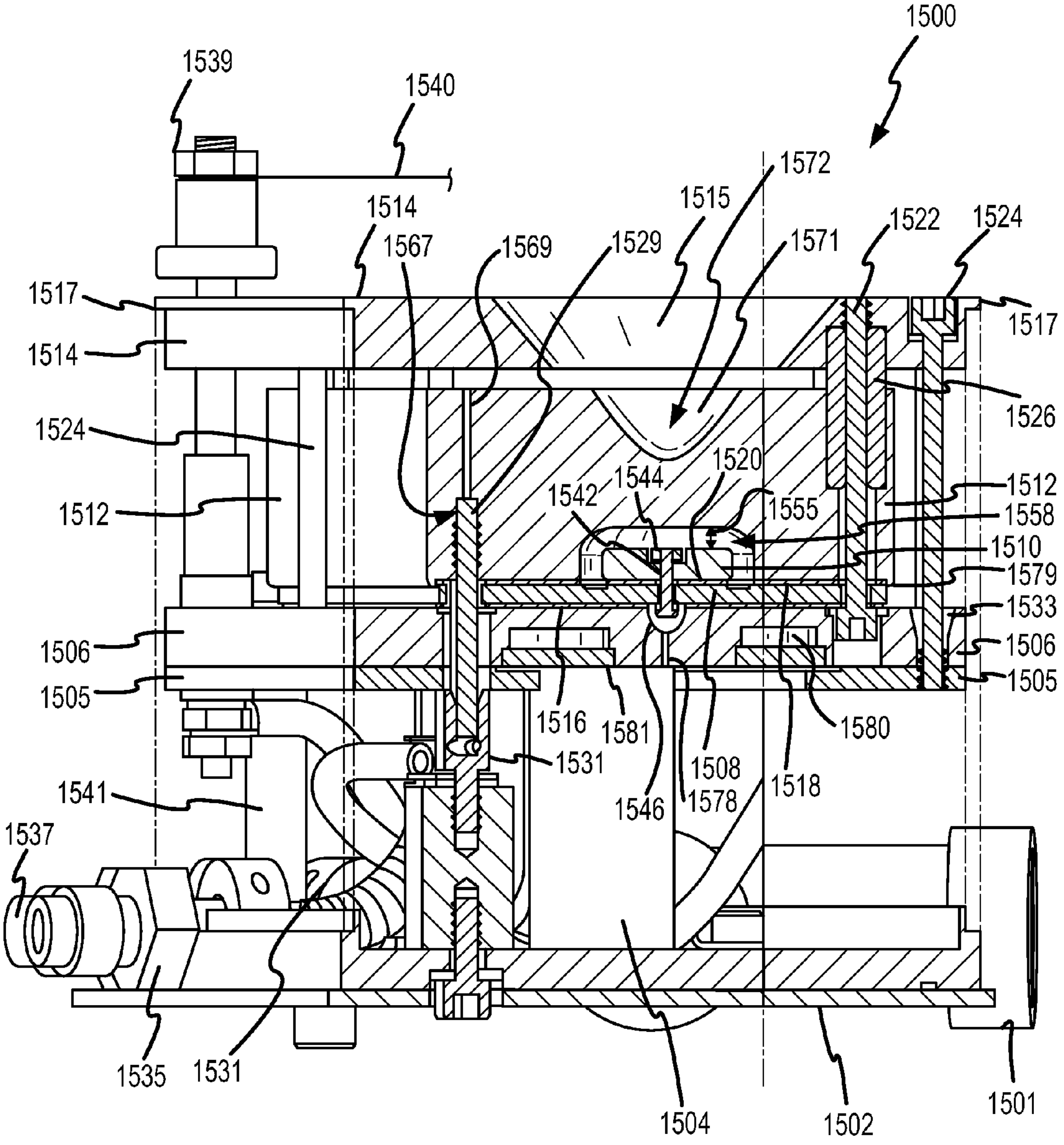
FIG. 18 is an elevation view in cross section of the high power ion source of FIG. 15 as indicated in FIG. 15.

With respect to FIGS. 15-18, a further implementation of an ion source 1500 with a removable anode assembly 1550 is depicted. Similar to prior embodiments described herein, the ion source 1500 is built upon a base 1502, which supports a generally cylindrical magnet 1504. An annular anchor plate 1505 with a central opening is positioned above the base 1502 and about the magnet 1504 and is attached to the bottom of cooling plate 1506. The cooling plate 1506, which is a fluid-cooled plate as depicted in FIGS. 15, 17, and 18, is supported by standoffs 1541. The anode assembly 1550 is composed primarily of a thermal control plate 1508, a gas distributor 1510, an anode 1512, and a pole piece 1514. The thermal control plate 1508 is supported by the cooling plate 1506, which is considered part of a base assembly 1552 of the ion source 1500. The thermal control plate 1508 further supports the gas distributor 1510 and the anode 1512. The pole piece 1514 is mounted above and separated from the anode 1512 to ensure electrical isolation between the anode 1512 and the pole piece 1514 to which a cathode 1540 of opposite charge to the anode 1512 is mounted.

In addition to these primary components, a series of thermal transfer sheets may be interposed between several of the components. As depicted in FIGS. 16-18, a first thermal transfer sheet 1516 may be interposed between the cooling plate 1506 and the thermal control plate 1508. Similarly, a second thermal transfer sheet 1518 may be placed between the bottom of the anode 1512 and the top of the thermal control plate 1508. A third thermal transfer sheet 1520 is inserted between the gas distributor 1510 and the top of the thermal control plate 1508. Each of the thermal transfer sheets 1516, 1518, 1520 may be made of a material that has both physical compliance and thermal transfer properties (e.g., graphite foil or a thermally conductive elastomer sheet) to mechanically interface with the cooling plate 1506, the thermal control plate 1508, the gas distributor 1510, and the anode 1512 while allowing heat transfer from the anode 1512 and the gas distributor 1510 to the cooling plate 1506 through the electrically insulating thermal control plate 1508. In alternative embodiments, the thermal transfer sheets 1516, 1518, 1520 may be made of materials that are also electrically conductive or electrically insulating.

As depicted in FIGS. 16-18, the gas distributor 1510 is attached to the thermal control plate 1508 by a set of three gas distributor bolts 1542 and corresponding nuts 1544. The gas distributor 1510 defines three bolt holes 1548 through which the bolts 1542 pass. An upper section of the bolt holes 1548 may be of a greater diameter than a lower section of the bolt holes 1548 to form a cylindrical recess or counterbore 1549 (see FIG. 23) within which the nut 1544 seats. The third thermal transfer sheet 1520 is sandwiched between the gas distributor 1510 and the top of the thermal control plate 1508. The third thermal transfer sheet 1520 defines three notches 1554, openings, or holes about its perimeter through which the bolts 1542 pass.

The anode 1512 is generally a cylindrical toroid bounding a central hole 1572. An annular bottom face 1556 of the anode 1512 defines an annular recess 1558 of a diameter greater than the narrowest diameter of the central hole 1572 forming the toroid shape of the anode 1512. The diameter of the annular recess 1558 is also greater than the outer diameter of the gas distributor 1510 and deeper than the height of the gas distributor 1510. The annular recess 1558 in combination with the central hole 1572 thus provide an offset space between the anode 1512 and the gas distributor 1512 when the anode 1512 is attached to the thermal control plate 1508 as described below.

The anode 1512 is bolted to both the thermal control plate 1508 and the pole piece 1514 using a set of four inner bolts 1522. The pole piece 1514 defines a set of four threaded bores 1528 designed to receive threaded ends of the inner bolts 1522. The anode 1512 similarly defines a set of four bores 1564 (see also FIG. 25) through which the inner bolts 1522 pass in order to engage the pole piece 1514. A tubular insulation column 1526 may surround a portion of each inner bolt 1522 as the inner bolts 1522 pass through the bores 1564 in the anode 1512. The bores 1564 are larger in diameter than the inner bolts 1522, but the inner bolts 1522 fit snugly within the shaft of the insulation columns 1526. In this manner, the inner bolts 1522 are centered within the bores 1564 and are spaced apart from, and thus insulated from, the inner walls of the bores 1564 through the anode 1512. Insulation and separation of the inner bolts 1522 from the bores 1564 in the anode 1512 helps maintain the difference in potential between the anode 1512 and the pole piece 1514, which is typically at ground.

The bores 1564 in the anode 1512 may be composed of two or more sections of varying diameters. In FIGS. 16-18 the anode 1512 is compose of an upper section 1566, a short intermediate section 1565, and a lower section 1561. The lower section 1561 may be slightly larger in diameter than the shafts of the inner bolts 1522. The short intermediate section 1565 may be formed of a diameter substantially the same as the outer diameter of the insulation columns 1526 in order to hold the insulation columns 1526 snugly within the bores 1564. Similarly, a short intermediate section 1585 of the threaded bores 1528 in the pole piece 1514 may be formed of a diameter substantially the same as the outer diameter of the insulation columns 1526 in order to hold the insulation columns 1526 snugly within the threaded bores 1528. The upper section 1566 of the bores 1564 may be slightly larger in diameter than the diameter of the insulation column 1526.

Similarly, the bores 1528 in the pole piece 1514 may be composed of two or more sections of varying diameters. In FIGS. 16-18 the pole piece 1514 is compose of an upper section 1587, a short intermediate section 1585, and a lower section 1583. The upper section 1587 defines the threads which engage the threaded end of the inner blots 1522. The short intermediate section 1585 may be formed of a diameter substantially the same as the outer diameter of the insulation columns 1526 in order to hold the insulation columns 1526 snugly within the bores 1528. The lower section 1583 of the threaded bores 1528 in the pole piece 1514 may be of a slightly larger in diameter than the diameter of the insulation column 1526.

As noted, the diameters of the upper sections 1566 of the bores 1564 in the anode 1512 and the lower sections 1583 of the threaded bores 1528 in the pole piece 1514 may be slightly larger than the diameter of the insulation column 1526 adjacent to the interface between the pole piece 1514 and the anode 1512. This larger diameter may be used to provide a directionally shadowing shield that limits or prevents line-of-sight deposition of possibly conductive sputtered materials from depositing on the insulation columns 1526. The insulation columns 1526 may also be of a height greater than the combined depth of the upper section 1566 and the intermediate section 1565 of the bores 1564 in the anode 1512 and the intermediate section 1585 and the lower section 1583 of the bores 1528 in the pole piece 1514. In this manner, the insulation columns 1526 provide a separation distance between the anode 1512 and the pole piece 1514 to further insulate the anode 1512 from the pole piece 1514, which supports the cathode 1540.

The second thermal transfer sheet 1518 also defines a set of four apertures 1562 through which a respective one of the four inner bolts 1522 passes. The second thermal transfer sheet 1518 is sandwiched between a bottom face 1556 of the anode 1512 and the thermal control plate 1508. As noted, the anode 1512 is generally toroidal and thus the second thermal transfer sheet 1518 is shaped as a flat ring. The inner diameter of the ring of the second thermal transfer sheet 1518 is slightly larger than the outer diameter of the third thermal transfer sheet 1520 such that a separation distance is defined between the second thermal transfer sheet 1518 and the third thermal transfer sheet 1520 when the anode assembly 1550 is assembled.

The first thermal transfer sheet 1516 is generally disk-shaped and is placed on a bottom surface 1560 of the thermal control plate 1508. The first thermal transfer sheet 1516 defines a set of three apertures 1594 through which pass the bolts 1542 that attach the gas distributor 1510 to the thermal control plate 1508. The bolts 1542 attaching the gas distributor 1510 to the thermal control plate 1508 pass through apertures 1596 in the thermal control plate 1508. The apertures 1594 in the first thermal transfer sheet 1516 may be larger than the heads of the bolts 1542. The heads of the bolts 1542 are thus secured against the bottom surface 1560 of the thermal control plate 1508 through the apertures 1594 in the first thermal transfer sheet 1516.

The inner bolts 1522 also pass upward through apertures 1570 in the thermal control plate 1508. The first thermal transfer sheet 1516 also defines a set of four apertures 1563 through which a respective one of the four inner bolts 1522 passes. Washers 1530 may be provided adjacent to the heads of the inner bolts 1522. The heads of the inner bolts 1522 along with the washer 1530 interface with the first thermal transfer sheet 1516 against the bottom surface 1560 of the thermal control plate 1508. When the inner bolts 1522 are tightened within the pole piece 1514, the inner bolts 1522 thus hold the thermal control plate 1508 with the attached gas distributor 1510, the anode 1512, and the pole piece 1514, along with the intervening thermal transfer sheets 1516, 1518, 1520, together to form the anode assembly 1550.

The anode assembly 1550 is attached to the ion source base assembly 1552 by a set of four outer bolts 1524. The outer bolts 1524 extend through a set of four bores 1532 spaced equidistantly about the circumference of the pole piece 1514. The bores 1532 are formed with counterbores in an upper section 1589 (see FIG. 26B) opening to a top face 1574 of the pole piece 1514 to accept the heads of the outer bolts 1524. The heads of the outer bolts 1524 interface with an annular rim 1577 formed by the bores 1532 and may thus be recessed with respect to the top surface 1574 of the pole piece 1514. The outer bolts 1524 extend downward adjacent to, but spaced apart from, the outer wall of the anode 1512.

A set of four apertures 1538 are defined within the cooling plate 1506 and spaced equidistantly about the circumference of the cooling plate 1506. Each of the apertures 1538 is formed with a frustum-shaped countersink 1533 adjacent to the top surface of the cooling plate 1506 to aid in the guidance of the outer bolts 1524 through the apertures 1538. The anchor plate 1505 positioned underneath the cooling plate 1506 also defines a corresponding set of four threaded apertures 1545, each positioned in register with a respective aperture 1538 in the cooling plate 1506. Each outer bolt 1524 passes through a respective one of the apertures 1538 and is secured within a respective one of the threaded apertures 1545 within the anchor plate 1505, thus securing the anode assembly 1550 to the ion source base assembly 1552.

The cooling plate 1506 also defines a set of four apertures 1536 spaced equidistantly about the cooling plate 1506 adjacent to and at a slightly smaller radius than the threaded apertures 1538. The apertures 1536 are formed to accept the heads of the inner bolts 1522 on the bottom surface 1560 of the thermal control plate 1508. The apertures also define larger diameter counterbores 1551 opening to a top face 1576 of the cooling plate 1508. The counterbores 1551 in the apertures 1536 are provided to accept the diameter of the washers 1530 on the inner bolts 1522.

The cooling plate 1506 further defines a set of three cavities 1546 aligned with and sized to accept the heads of the gas distributor bolts 1542 interfacing with the bottom surface 1560 of the thermal control plate 1508. A vent hole 1578 may extend through the cooling plate 1506 from the bottom of each of the cavities 1546 to allow for gas evacuation when the ion source 1500 is placed under vacuum during operation. The apertures 1536 accepting the heads of the inner bolts 1522 and the cavities accepting the heads of the gas distributor bolts 1542 allow the thermal control plate 1508 and the first thermal transfer sheet 1516 to seat flush against the top surface 1576 of the cooling plate 1506 to provide maximum surface area contact for heat transfer between the cooling plate 1506 and the thermal control plate 1508.

Once the cathode 1540, either a filament cathode as depicted in FIGS. 15-18 or a hollow cathode (not shown) is removed, the anode assembly 1550 is easily accessible by simply unbolting the anode assembly 1550 from the anchor plate 1505 and lifting the anode assembly 1550 from the base assembly 1552. The anode assembly 1550 contains all of the consumable items that generally may require replacement over the normal lifetime of operation of the ion source 1500. Consumable components may include the thermal control plate 1508, the gas distributor 1510, the anode 1512, and the intermediate thermal transfer sheets 1516, 1518, 1520 and related hardware fasteners.

Figure 19:
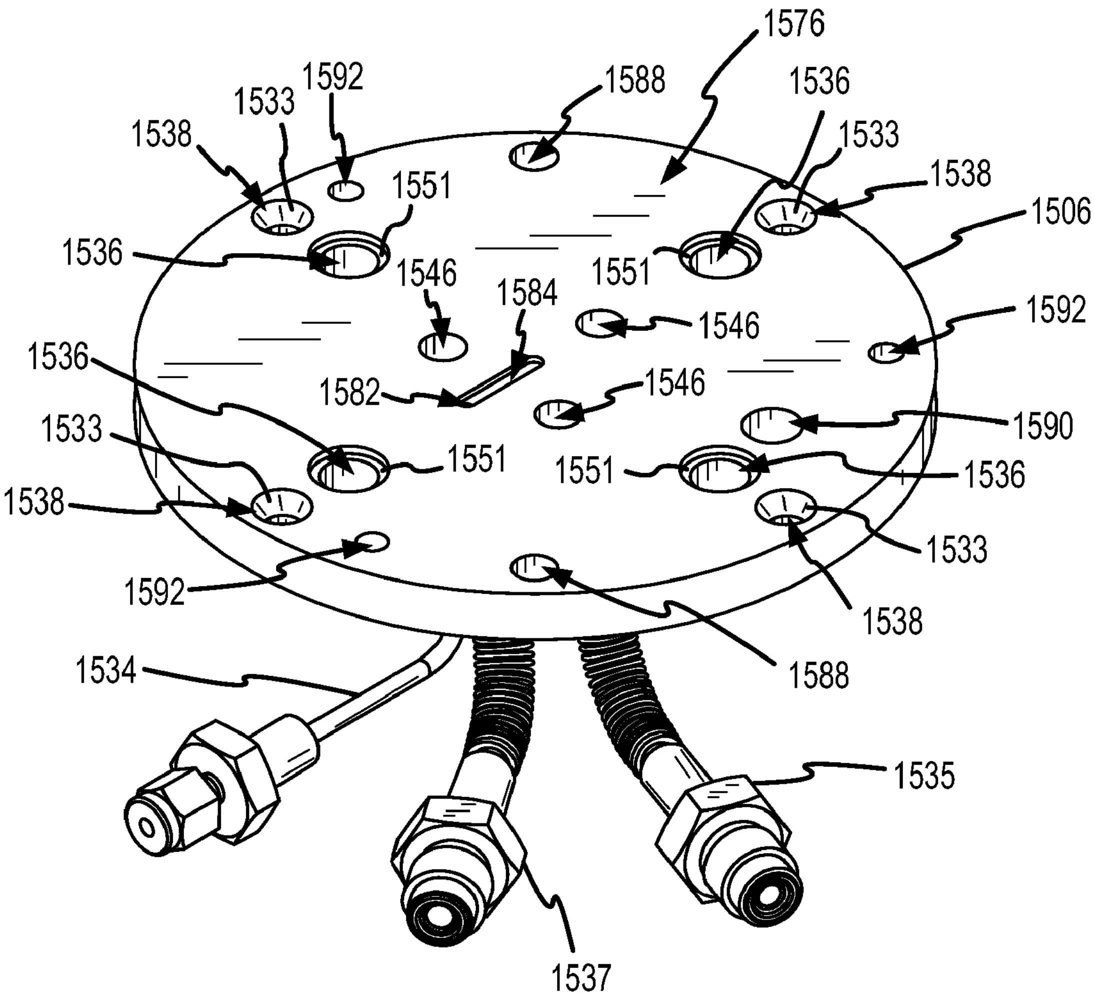
FIG. 19 is an isometric view of the cooling plate with attached fluid lines in the base assembly of the high power ion source of FIG. 15.

The cooling plate 1506 is depicted in greater detail in FIG. 19. The cooling plate is generally a disk of milled copper or stainless steel of substantially constant thickness from center to circumference. As previously described, the cooling plate 1506 defines a number of apertures, namely a set of four apertures 1536 for accepting the heads of the inner bolts 1522, a set of four countersunk apertures 1538 through which the outer bolts 1524 pass, and a set of three cavities 1546 and corresponding vent holes 1578 for accepting the heads of the bolts 1542 securing the gas distributor 1510.

The cooling plate 1506 further defines several additional apertures or cavities serving various functions. These include a set of three apertures 1592 positioned equidistantly about the perimeter of the cooling plate 1506 for accepting a corresponding set of standoff posts 1541 that support the anchor plate 1505 and the cooling plate 1506 above the base 1502 (see FIGS. 15, 17, and 18). The standoff posts 1541 are secured to the cooling plate 1506 with screws 1543 that extend through the apertures 1592 and corresponding apertures within the anchor plate 1505. A first electrode aperture 1590 is also formed in the cooling plate 1506 for accepting a downward extending electrode 1529 from the anode 1512 to interface with an anode power connector 1531 (See FIGS. 16 and 18).

The cooling plate 1506 further defines a cylindrical recess 1586 centered on the bottom side of the cooling plate 1506 that provides clearance for the magnet 1504. The depth of the recess 1586 is such that there is a small, controlled, axial clearance to prevent the cooling plate 1506 from bearing on the magnet. Thus, all support of the cooling plate 1506, and ultimately of the anode assembly 1550, is on the standoffs 1541. The cavities 1546 and corresponding vent holes 1578 are positioned at a distance radially from the center of the cooling plate 1506 beyond the diameter of the cylindrical recess 1586.

A gas port 1582 is also formed through the cooling plate 1506. The gas port 1582 is similarly positioned at a distance radially from the center of the cooling plate 1506 beyond the diameter of the cylindrical recess 1586. The gas port 1582 is also positioned between two of the cavities 1546. A gas duct 1534 that feeds a gas to the ion source 1500 for ionization interfaces with the gas port 1582. As shown in FIG. 17, a lower section of the gas port 1582 may be of larger diameter than an upper section such that the gas duct 1534 may be inserted into the lower section of the gas port 1582 until the end of the gas duct 1534 interfaces with a shoulder of the gas port 1582 at the point of change in diameter. Further, the inner diameter of the gas duct 1534 may be the same as the diameter of the upper section of the gas port 1582 in the cooling plate 1506 to maintain a constant diameter for gas flow.

A gas channel 1584 may further be formed in the top surface 1576 of the cooling plate 1506. The gas channel 1584 connects at a first end with the gas port 1582 and extends radially to the center of the cooling plate 1506.

Figure 20:
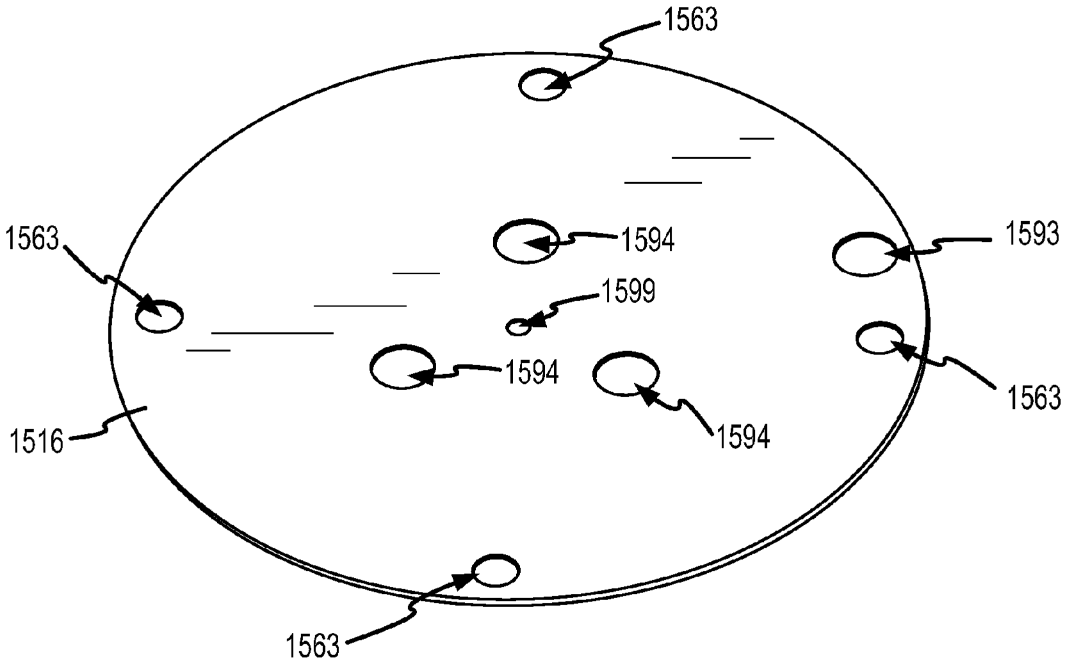
FIG. 20 is an isometric view of the thermal transfer sheet between the cooling plate and the thermal control plate in the anode assembly of the high power ion source of FIG. 15.

The disk-shaped, first thermal transfer sheet 1516 is shown in additional detail in FIG. 20. The first thermal transfer sheet 1516 seals the top of the gas channel 1584, thereby directing gas to flow along the gas channel 1584 to the center of the cooling plate 1506. The first thermal transfer sheet 1516 may be made of compressible graphite foil or other mechanically compliant, thermally conductive material. Graphite foil is electrically conductive in this example. However, other electrically insulating or conductive materials could be employed including thermally conductive elastomers. The first thermal transfer sheet 1516 may be on the order of 0.005 to 0.030 inches in thickness, but may be greater or lesser. In addition to the apertures 1563 that accept the inner bolts 1522 and the apertures 1594 that accept the bolts 1542 securing the gas distributor 1510, the first thermal transfer sheet 1516 defines a first gas duct 1599 in the center of the first thermal transfer sheet 1516. The first gas duct 1599 aligns with the second end of the gas channel 1584 in the center of the cooling plate 1506 to allow the gas to pass through the first thermal transfer sheet 1516 to the thermal control plate 1508. The first thermal transfer sheet 1516 also defines a second electrode aperture 1593 that accepts the downward extending electrode 1529 from the anode 1512 to interface with an anode power connector 1531 (see FIGS. 16 and 18).

Figure 21:
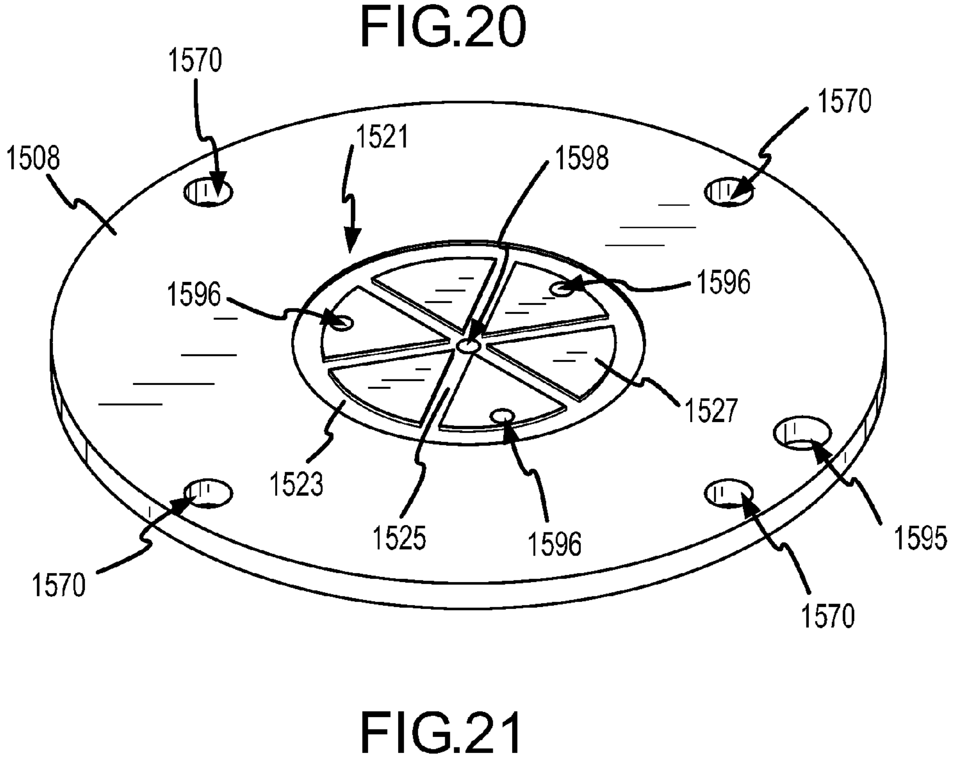
FIG. 21 is an isometric view of the thermal control plate in the anode assembly of the high power ion source of FIG. 15.

The thermal control plate 1508 is shown in additional detail in FIG. 21. The thermal control plate 1508 is generally disk-shaped and may be formed of a ceramic material, for example, boron nitride and boron nitride composites that have high thermal conductivity and thermal stress resistance such as a boron nitride/aluminum nitride composite. A range of thickness for the thermal control plate 1508 may be between 0.100 and 0.375 inches, but could be greater or lesser in thicknesses. Also the thermal control plate 1508 may serve to electrically isolate the anode 1512 from the cooling plate 1506. The thermal control plate 1508 is thus both thermally conductive and electrically insulating.

As previously noted, the thermal control plate 1508 defines several sets of apertures, namely the set of four apertures 1570 through which the inner bolts 1522 extend and the set of three apertures 1596 through which the gas distributor bolts 1542 extend. A third electrode aperture 1595 is further defined in the thermal control plate 1508 adjacent to the outer edge of the thermal control plate 1508 through which the downward extending electrode 1529 from the anode 1512 extends to interface with an anode power connector 1531 mounted on the base 1502.

A second gas duct 1598 is also defined in the center of the thermal control plate 1508 and is aligned with the first gas duct 1599 from the first thermal transfer sheet 1516. An annular groove or recess 1523 is defined in the top surface 1521 of the thermal control plate 1508 surrounding the second gas duct 1598 and centered on the thermal control plate 1508. The outer diameter of the annular recess 1523 may be slightly larger than the diameter of the gas distributor 1510 and the inner diameter of the annular recess 1523 may be slightly smaller than the diameter of the gas distributor 1510. In an alternative embodiment, the thermal control plate 1508 may not have an annular recess at all, A set of six radial channels 1525 extend outward equiangularly from the second gas duct 1598 to intersect with the annular recess 1523, although a greater or lesser number of channels could be used. The radial channels 1525 may be the same depth as the annular recess 1523 and the exit plane of the second gas duct 1598 may be at the same level as the radial channels 1525 which intersect it. Together the radial channels 1525 and the annular recess 1523 demarcate six wedge-shaped islands 1527 of the same height as the top surface 1521 of the thermal control plate 1508. The set of three apertures 1596 extend through three of the islands 1527 separated from each other by one of the other three islands 1527 with solid surfaces. In an alternate embodiment the three apertures 1596 may be threaded to fasten the gas distributor bolts 1542 therein. In this configuration, gas exiting the second gas duct 1598 spreads out radially along the radial channels 1525 underneath the gas distributor 1510 to the annular recess 1523 where the gas ultimately flows out from under the perimeter of the gas distributor 1510.

Other arrangements for input gas conductance may be produced within the thermal control plate 1508. For example, the gas duct 1598 may communicate with a disk-shaped recess (not illustrated) within the thermal control plate 1508, rather than the gas channels and the annular recess, which would allow the gas to flow around the edge of or through holes within the gas distributor of the ion source when fully assembled. By this means, a gas distribution plenum (similar to the gas plenum 1436 in FIG. 14) would be produced behind the gas distributor 1510 that would help facilitate injection of the input gas into the center bottom opening of the anode 1512.

Figure 22:
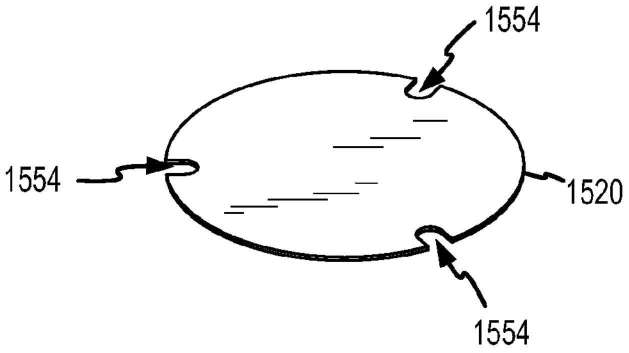
FIG. 22 is an isometric view of the thermal transfer sheet between the thermal control plate and the gas distributor in the anode assembly of the high power ion source of FIG. 15.

The third thermal transfer sheet 1520 is shown in greater detail in FIG. 22. The third thermal transfer sheet 1520 is generally a thin, disk of compressible graphite foil or other mechanically compliant, thermally conductive material. Graphite foil is electrically conductive in this example; however, other electrically insulating or conductive materials could be employed including thermally conductive elastomers. As with the first thermal transfer sheet 1516, the third thermal transfer sheet 1520 may be on the order of 0.005 to 0.030 inches thick if made of compressible graphite foil, but may be greater or lesser as indicated by design considerations. Three notches 1554, recesses, or holes are formed in the circumferential edge of the third thermal transfer sheet 1520. These notches 1554 are spaced equidistantly about the circumference of the third thermal transfer sheet 1520 and are aligned with the bolt holes 1548 in the gas distributor 1510. The gas distributor bolts 1542 pass through the notches 1554 in the third thermal transfer sheet 1520 to engage the gas distributor 1510.

Figure 23A:
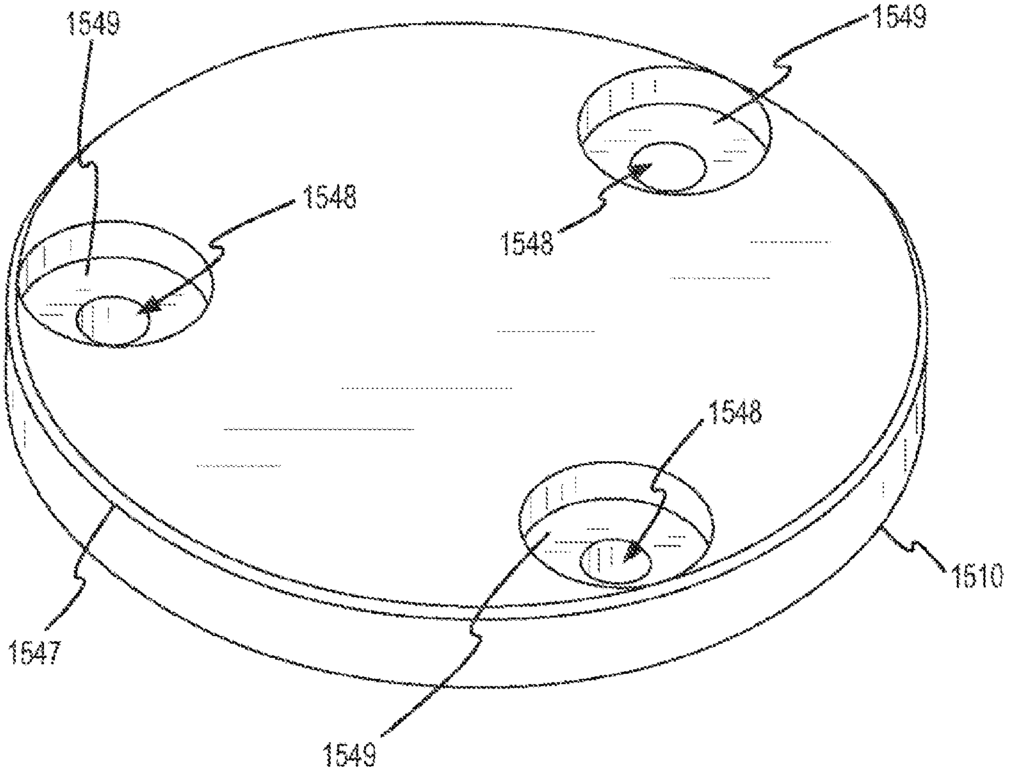
FIG. 23A is an isometric view of the gas distributor in the anode assembly of the high power ion source of FIG. 15.

The gas distributor 1510 is shown in greater detail in FIG. 23A. The gas distributor 1510 is a disk that may be made of either high-temperature, non-magnetic conductive materials such as stainless steel, molybdenum, titanium, tantalum, silicon, silicon-carbide or graphite or high-temperature, insulating materials such as quartz, aluminum-oxide, aluminum-nitride, boron nitride, or boron-nitride/aluminum-nitride composites material and may be on the order of 0.100 to 0.250 inches thick, but may be greater or lesser depending upon design considerations. The preferred selection of any one material for the gas distributor 1510 is dependent upon the compatibility of the material with the operating chemistry of the ion source 1500, the choice or style of specific clamping hardware, and the type of material contamination that is produced. Some material contamination may be permissible during operation of the ion source 1500, should material from the surface of the distributor 1510 be sputtered by the plasma supported within central hole 1572 of the anode 1512.

The top circumferential edge 1547 of the gas distributor 1510 may be rounded or beveled as shown. As noted above, three bolt holes 1548 are defined within the gas distributor 1510 and are spaced equidistantly apart about and adjacent to the circumference of the gas distributor 1510. There may be greater or fewer bolt holes as desired to secure the gas distributor 1510 to the thermal control plate 1508. A counterbore 1549 of larger diameter than the bolt holes 1548 is formed about each of the bolt holes 1548 to create a cylindrical recess sized to accept a nut 1544 that secures the gas distributor bolt 1542 to the gas distributor 1510. The depth of the counterbore 1549 is sufficiently deep to accommodate the thickness of the nut 1544 such that the nut 1544 does not extend above the top surface of the gas distributor 1510.

The diameter of the gas distributor 1510 and placement of the bolt holes 1548 and related counterbores 1549 about the perimeter may be chosen with respect to the annular recess 1558 of the anode 1512. The diameter of the gas distributor 1510 may be such that bolt holes 1548 and related counterbores 1549 are shadow-shielded by the annular recess 1558 of the anode 1512. By locating the bolt holes 1548 and counterbores 1549 under the recess 1558 of the anode 1512, the bolts may be protected from coating, sputter deposition, erosion, and contamination that may cause arcing of the plasma, degradation of the mechanical attachment of the gas distributor 1510 to the thermal control plate 1508, or other problems.

Alternatively, the depth of the counterbore 1549 may be sufficiently deep to accommodate the thickness of the head of a gas distributor bolt 1542 in an embodiment in which the gas distributor bolts 1542 are screwed into threaded apertures within the thermal control plate or fastened to nuts on the bottom side of the thermal control plate. In a further alternate implementation, the bolt holes 1548 may be threaded and the gas distributor bolts 1542 could be fastened directly to the gas distributor 1510. In such a design, the bolt holes 1548 may be blind tapped holes or tapped through-holes and no counterbore 1549 in the top surface is required.

Figure 23B:
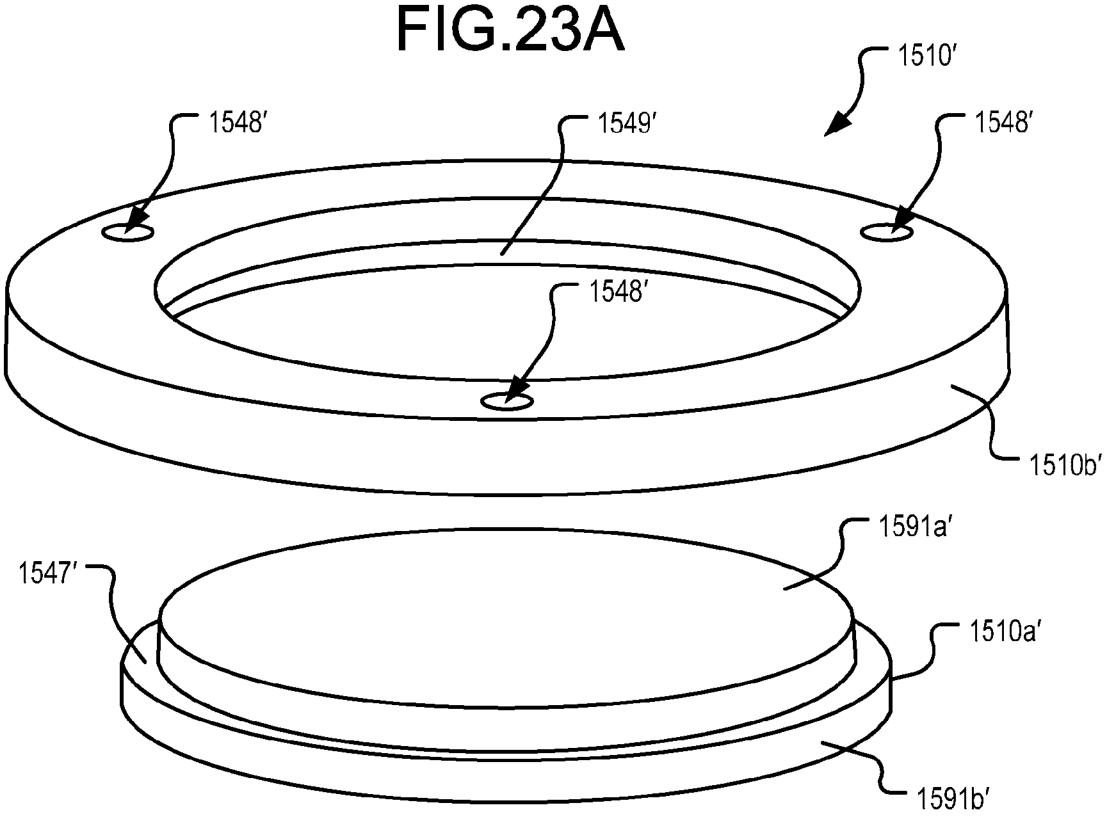
FIG. 23B is an isometric view of an alternate version of a gas distributor for incorporation in the anode assembly of the high power ion source of FIG. 15.

In some implementations it may be advantageous split the gas distributor 1510' into a system of split components comprising a consumable component and a fastening component as shown in FIG. 23B. In most applications, the gas discharge that forms near the ion source anode and gas distributor will generally erode the central top area of the gas distributor through ion sputtering leaving an ever deepening 'bowl-shaped' wear track in the central surface area of the gas distributor over time. By splitting the gas distributor 1510' into a consumable central plate component 1510*a'* and an outer circumferential clamping ring 1510*b'* as shown, it is possible to have a sub-assembly or system composing the gas distributor 1510' wherein the central plate component 1510*a'* may be consumed and replaced during regularly scheduled preventative maintenance while retaining the outer clamping ring 1510*b'* for repeated use.

The central plate component 1510*a'* may be formed as a circular disk of varied diameter between a top face and a bottom face. A top portion 1591*a* of the central plate component 1510*a'* with a first thickness may have a smaller diameter than a bottom portion 1591*b* of a second thickness, thereby forming a first circumferential ledge 1547' about a circumference of the central plate component 1510*a'*.

The clamping ring 1510*b'* may be formed as an annular ring with a larger outer diameter than the diameter of the bottom portion 1591*b* of the central plate component 1510*a'*. The inner diameter of the clamping ring 1510*b'* may be stepped from a smaller diameter at the top to a larger diameter at the bottom to form a second circumferential ledge 1549'. The smaller inner diameter of the clamping ring 1510*b'* may be sized to accept the diameter of the top portion 1591*a* of the central plate component 1510*a'* and the larger inner diameter of the clamping ring 1510*b'* may be sized to accept the diameter of the bottom portion 1591*b* of the central plate component 1510*a'*. Thus, the first circumferential ledge 1547' of the central plate component 1510*a'* mates with the second circumferential ledge 1549' of the clamping ring 1510*b'* along a circumferential interface.

The circumferential clamping ring 1510*b'* may define mounting apertures with counter bores for recessing nuts on fastening bolts and circumferential edge features similar to those discussed above with respect to the gas distributor of FIG. 23A. However, the clamping ring 1510*b'* may alternately define threaded through holes 1548' to receive mounting screws that affix the gas distributor to the underlying thermal control plate via the clamping ring 1510*b'*.

The circumferential interface between the central plate component 1510*a'* and the clamping ring 1510*b'* may have either beveled or overlapping features and close tolerances. These features and tolerances may help manage any mechanical interference and related radial material stresses that may arise from thermal cycling of the gas distributor 1510' components when used in the ion source assembly. The mechanical interface features may be designed to maintain clamping forces or to translate forces from any radial, mechanical interference due to thermal expansion of the parts to a downward axial force. The axial force helps to maintain good thermal contact between the central plate component 1510*a'* and the outer clamping ring 1510*b'* and any underlying thermal transfer sheet or thermal control plate. Such mechanical clamping features at the interface boundary help maintain a clamping force when the central plate component 1510*a'* and the outer clamping ring 1510*b'* are fabricated from dissimilar materials that may have different thermal expansion properties.

Such a gas distributor assembly 1510' or system may also offer design flexibility depending upon the expense and properties of the central plate component 1510*a'* being used. Cost savings may be realized by making the separable circumferential clamping ring 1510*b'* a re-usable component. The circumferential clamping ring 1510*b'* may be fabricated from less expensive materials, e.g., non-magnetic stainless steel, than the consumable central plate component 1510*a'*, which may be fabricated from relatively more expensive material, e.g. tantalum, titanium, tungsten, pyrolytic graphite, and uncommon sintered ceramics.

Figure 24:
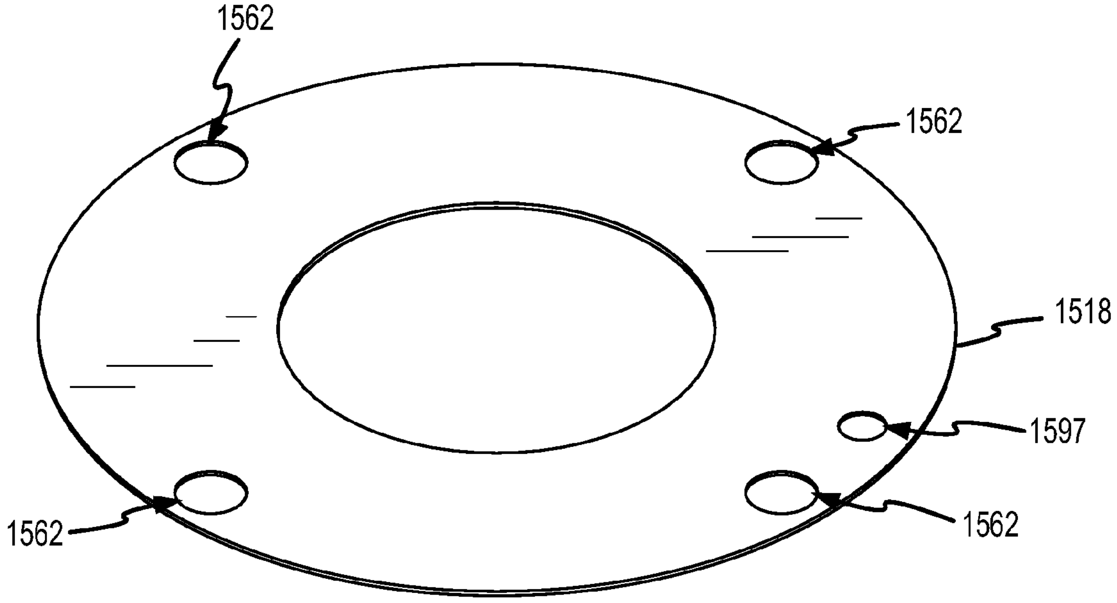
FIG. 24 is an isometric view of the thermal transfer sheet between the thermal control plate and the anode in the anode assembly of the high power ion source of FIG. 15.

The second thermal transfer sheet 1518 is shown in greater detail in FIG. 24. The second thermal transfer sheet 1518 is generally a thin, annular disk of compressible graphite foil or other, thermally conductive, mechanically compliant material. Graphite foil is electrically conductive in this example. However, other electrically insulating or conductive materials could be employed including thermally conductive elastomers. As with the other thermal transfer sheets, the second thermal transfer sheet 1518 may be on the order of 0.005 to 0.030 inches thick, or greater or lesser depending upon design considerations, if made of compressible graphite foil. Four apertures 1562 may be formed adjacent to the circumferential edge of the second thermal transfer sheet 1518. These apertures 1562 may be spaced equidistantly about the circumference of the second thermal transfer sheet 1518 and are aligned with the bore holes 1564 in the anode 1512. The inner bolts 1522 pass through the apertures 1562 in the second thermal transfer sheet 1518 as the inner bolts 1522 extend through the thermal control plate 1508 and anode 1512 to ultimately engage the pole piece 1514. The second thermal transfer sheet 1518 also defines a fourth electrode aperture 1597 that accepts the downward extending electrode 1529 from the anode 1512 to interface with the anode power connector 1531.

Figure 25A:
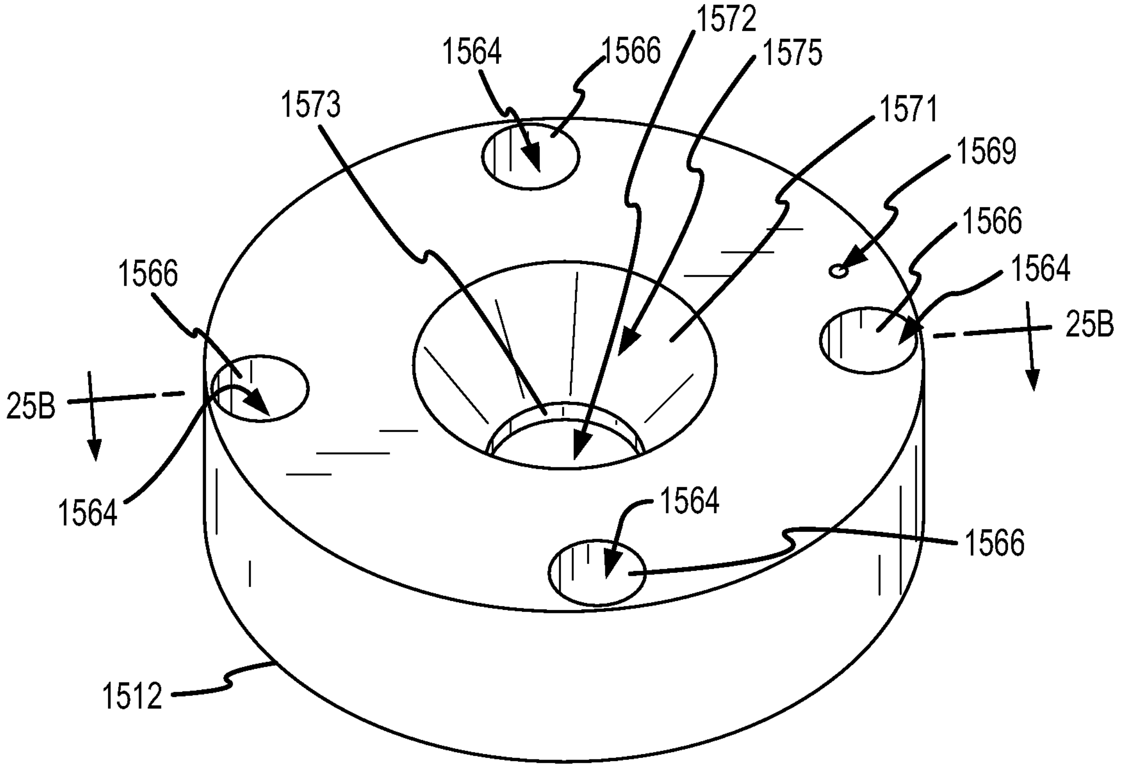
FIG. 25A is an isometric view of the anode in the anode assembly of the high power ion source of FIG. 15.
Figure 25B:
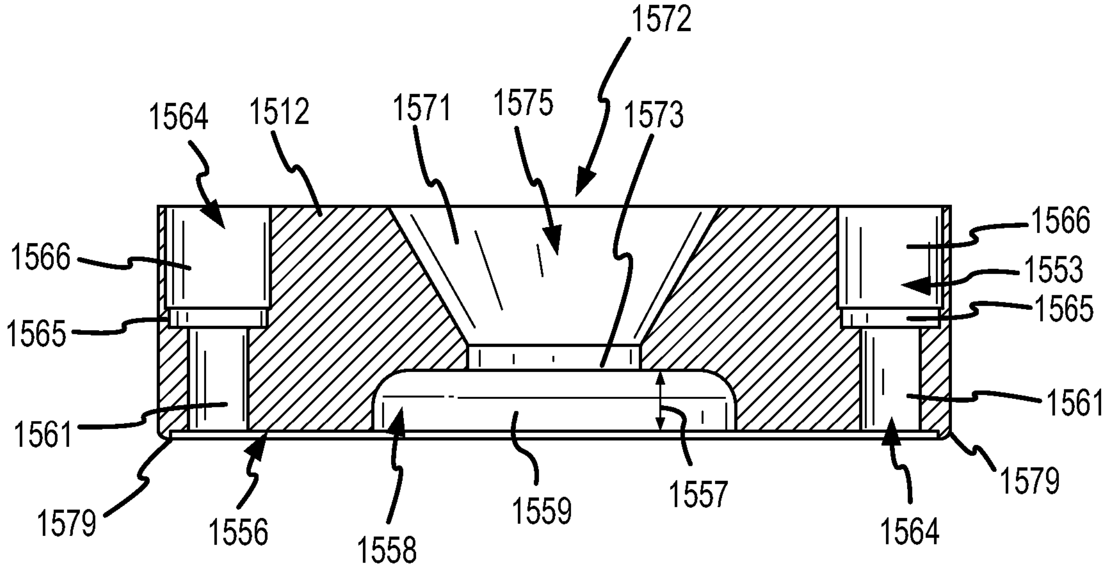
FIG. 25B is an elevation view in cross section of the anode of FIG. 25A as indicated in FIG. 25A.

FIGS. 25A and 25B depict the anode 1512 in greater detail. The anode 1512 is a thick, cylindrical toroid formed of an electrically conductive, non-magnetic material, for example, stainless-steel, copper, molybdenum, titanium, silicon, silicon-carbide or graphite. The central hole 1572 of the anode 1512 may be defined by one or more shapes as the interior wall 1575 of the anode 1512 transitions from the top to the bottom of the anode 1512. The surface of a top section 1571 of the interior wall 1575 may be frustum-shaped and transition from a wide diameter opening at the top of the anode 1512 to a narrower diameter opening at the bottom of the frustum-shaped top section 1571. The surface features of interior wall 1575 may be smooth and continuous or can have variance of surface contours (axial and/or circumferential) along its length.

The surface of an intermediate section 1573 of the interior wall 1575 may be cylindrical with a diameter equal to the narrower diameter of the bottom of the frustum-shaped top section 1571. The diameter of the intermediate section 1573 may be slightly smaller than or equal to the diameter of a circle inscribed within the interior edges of cylindrical recesses 1549 in the gas distributor 1510.

The surface of a bottom section 1559 of the interior wall 1575 may be a radius or bevel that extends outward and downward from the cylindrical intermediate section 1573 to a larger diameter than the diameter of the gas distributor 1510 to form the annular recess 1558 described previously. The depth 1557 of the bottom section 1559 is greater than the thickness of the gas distributor 1510 such that there is a separation distance 1555 (see FIG. 18) between the top of the gas distributor 1510 and the anode 1512.

The bottom surface 1556 of the anode 1512 is slightly recessed to form an annular disk bounded by a lip 1579 at the outer circumference of the anode 1512. The circumference of the bottom surface 1556 is generally equivalent to the circumference of the thermal control plate 1508 such that the lip 1579 of the anode 1512 extends downward adjacent to the outer wall of the thermal control plate 1508. The bottom surface 1556 of the anode 1512 thus interfaces with the top surface 1521 of the thermal control plate 1508 and the lip 1579 engages the outer wall of the thermal control plate 1508 to align the anode 1512 and the thermal control plate 1508 and prevent lateral movement therebetween.

As shown in FIGS. 25A and 25B and described above, the anode 1512 defines a set of four bores 1564 through which the inner bolts 1522 pass. An upper section 1566 of the bores 1522 may be larger in diameter than a lower section 1561 to accept the larger diameter of the insulation column 1526. The upper section 1566 may be larger in diameter than the insulation column 1526 as well. An intermediate section 1565 of generally the same diameter as the insulation column 1526 may be formed in the bores 1564 between the upper sections 1566 and the lower sections 1561 within which the insulation column 1526 snugly fits. The intermediate section 1565 is thus smaller in diameter that the upper section 1566 and greater in diameter than the lower section 1561, thus forming a set of stepped ledges within the bore holes 1564.

The lower sections 1561 of the bores 1564 are also larger in diameter than the inner bolts 1522, but the inner bolts 1522 fit snugly within the shaft of the insulation columns 1526. In this manner, the inner bolts 1522 are centered within the bores 1564 and are spaced apart from, and thus insulated from, the inner walls of the bores 1564 through the anode 1512. The inner bolts 1522 are insulated and separated from the bores 1564 in the anode 1512 in order to prevent a short between the anode 1512 and the opposing charge and polarity of the pole piece 1514 supporting the cathode 1540 to which the bolts 1522 are attached. The concentric intermediate and upper bore sections 1565, 1566 form a stepped inner annular space 1553 with a large length to separation distance aspect ratio between the outside surface of the insulation column 1526 and the upper bore section 1566 of the anode 1512. This high aspect ratio annular space 1553 serves as a shadow shield to prevent conductive coating along the length of the insulation column 1526 which may occur during normal operation and which could thereby result in an electrical conduction path between the anode 1512 and the pole piece 1514, which are at different electrical potentials.

The anode 1512 further defines an electrode receptacle 1567 open to the bottom surface 1556 of the anode 1512 and adjacent to the outer circumference of the anode 1512 and positioned between two of the bore holes 1564. The electrode receptacle 1567 is shown to good advantage in FIG. 18. The electrode receptacle 1567 may be positioned anywhere between a pair of adjacent bore holes 1564. In the exemplary embodiment depicted in FIGS. 18 and 25A the electrode receptacle 1567 is positioned closer to one bore hole than another in an adjacent pair. The electrode receptacle 1567 may be threaded to allow the anode electrode 1529 to be screwed into the electrode receptacle 1567. The electrode receptacle 1567 may only extend part way through the thickness of the anode 1567. A smaller diameter electrode vent 1569 in fluid communication with the electrode receptacle 1567 may extend above the electrode receptacle 1567 to form an opening in the top surface of the anode 1512. The electrode vent 1569 allows air or other gas to evacuate from the electrode receptacle 1567 when the ion source 1500 is placed under vacuum during operation.

Figure 26A:
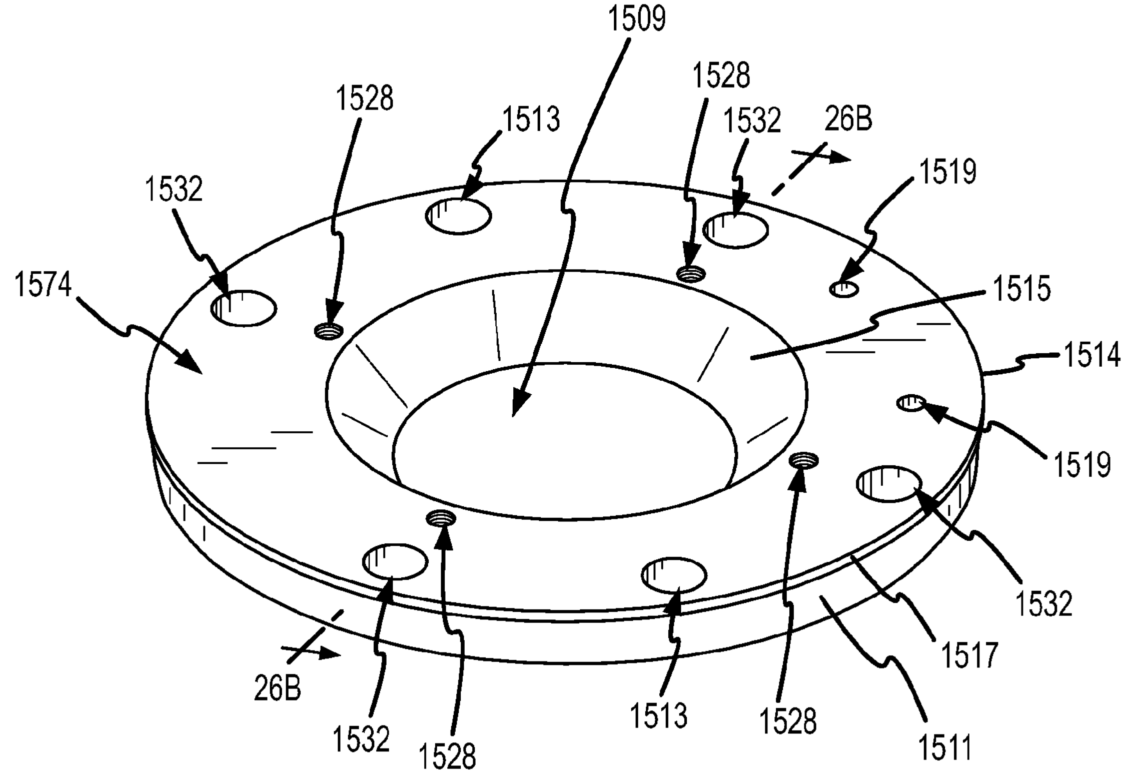
FIG. 26A is an isometric view of the pole piece in the anode assembly of the high power ion source of FIG. 15.
Figure 26B:
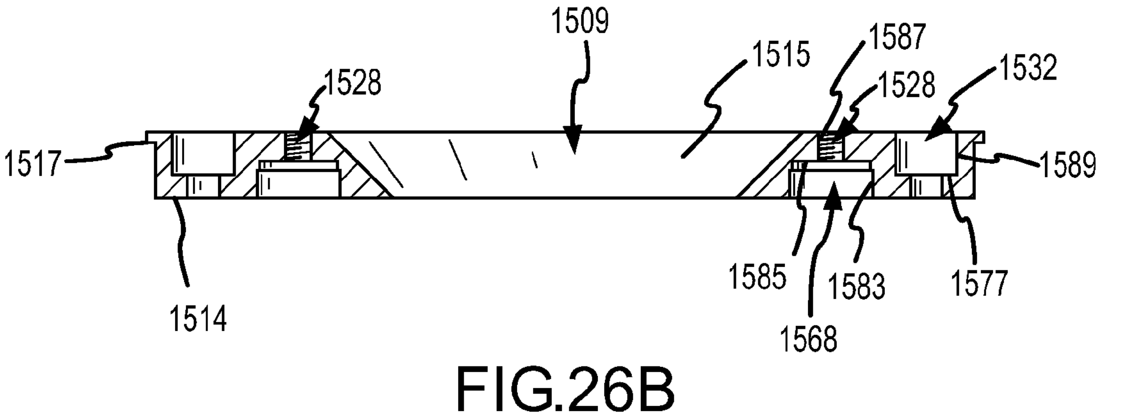
FIG. 26B is an elevation view in cross section of the pole piece of FIG. 26A as indicated in FIG. 26A.

FIGS. 26A and 26B depict the pole piece 1514 in greater detail. Similar to the anode 1512, the pole piece 1514 is a cylindrical toroid, but it is not as thick as the anode 1512. The pole piece may be formed of a magnetically permeable material, for example, 400 series stainless steel. The center hole 1509 of the pole piece 1514 is defined as by the interior wall 1515 of the pole piece 1514, which is frustum-shaped and transitions from a wide diameter opening at the top of the pole piece 1514 to a narrower diameter opening at the bottom of the pole piece 1514. The diameter of the center hole 1509 at the bottom of the pole piece 1514 may be close in size to the diameter of the central hole 1572 at the top of the anode 1512.

The top surface 1574 of the pole piece extends beyond the cylindrical exterior wall 1511 of the pole piece 1514 to form a lip 1517. The lip 1517 overhangs a sidewall (not shown in the figures) of the ion source 1500 that covers the components of the anode section 1550 and the base section 1552. The outer diameter of the pole piece 1514 measured at the exterior wall 1511 is slightly larger in diameter than the cooling plate 1506 and the anchor plate 1505.

As shown in FIGS. 26A and 26B and described above, the pole piece 1514 defines a set of four threaded bores 1528 in which the inner bolts 1522 are secured. The threaded bores 1528 are spaced equidistantly around and adjacent to the top edge of the interior wall 1515 defining the center opening 1509 in the pole piece 1514. A threaded upper section 1587 of the threaded bores 1528 may be smaller in diameter than a lower section 1583. The lower section 1583 may be larger in diameter than the insulation column 1526 as well. An intermediate section 1585 of generally the same diameter as the insulation column 1526 may be formed in each of the threaded bores 1528 between the upper sections 1587 and the lower sections 1583 within which the insulation column 1526 snugly fits. The intermediate section 1585 may be greater in diameter that the upper section 1587 and smaller in diameter than the lower section 1583, thus forming a set of stepped ledges within the threaded bore holes 1528.

The concentric intermediate and lower bore sections 1585, 1583 form a stepped inner annular space 1568 with a large length to separation distance aspect ratio between the outside surface of the insulation column 1526 and the lower section 1583 of the bore 1528 in the pole piece 1514. This high aspect ratio annular space 1568 serves as a shadow shield to prevent conductive coating along the length of the insulation column 1526 which may occur during normal operation and which could thereby result in an electrical conduction path between the anode 1512 and the pole piece 1514, which are at different electrical potentials.

The pole piece 1514 also defines a second set of bores 1532 spaced equidistantly about the circumference of the pole piece 1514. Each of the bores 1532 may be radially aligned with a respective one of the threaded bores 1528 as depicted in FIGS. 26A and 26B, but the bores 1532 and the threaded bores 1528 need not be so aligned. The bores 1532 are spaced apart at a diameter greater than the outer diameter of the anode 1512 to position the outer bolts 1524 outside the outer wall of the anode 1512. The bores 1532 are formed with larger diameter counterbores through an upper section 1589 opening to the top surface 1574 of the pole piece 1514. The diameter and depth of the upper section 1589 is sized to allow the head of an outer bolt 1524 inserted within the bore 1532 to be recessed within the pole piece 1514. The counterbore form of the upper section 1589 creates a ledge 1577 within the bores 1532 against which the head of an outer bolt 1524 is secured.

The pole piece 1514 further defines a pair of post apertures 1513 that engage the cathode posts 1539 that support the cathode element 1540. The post apertures 1513 may be positioned symmetrically opposite each other on the pole piece 1514 and spaced apart from each other at a diameter greater than the outer diameter of the anode 1512. The post apertures 1513 may be spaced equidistantly between adjacent bores 1532 as depicted in FIG. 26A or the post apertures 1513 may be otherwise positioned about the pole piece 1514.

The pole piece 1514 may additionally define a pair of mounting holes 1519 for attaching a hollow cathode electron source (not shown) to the ion source 1500 in place of the cathode element 1540. As shown in FIGS. 15 and 16, when a cathode element 1540 is used, the mounting holes 1519 may merely be closed off by a pair of cap screws 1507. The mounting holes 1519 may be positioned between any two adjacent bores 1532 as depicted, but the mounting holes 1519 could also be positioned on each side of a single bore 1532. It may be desirable to position the mounting holes 1519 between two adjacent bore holes 1532 that are not already a pair flanking one of the post apertures, but this need not be the case. Alternatively, mounting holes may be on the base 1502 to support a hollow cathode electron source, which may remain in place when the anode assembly 1550 is serviced.

Figure 27:
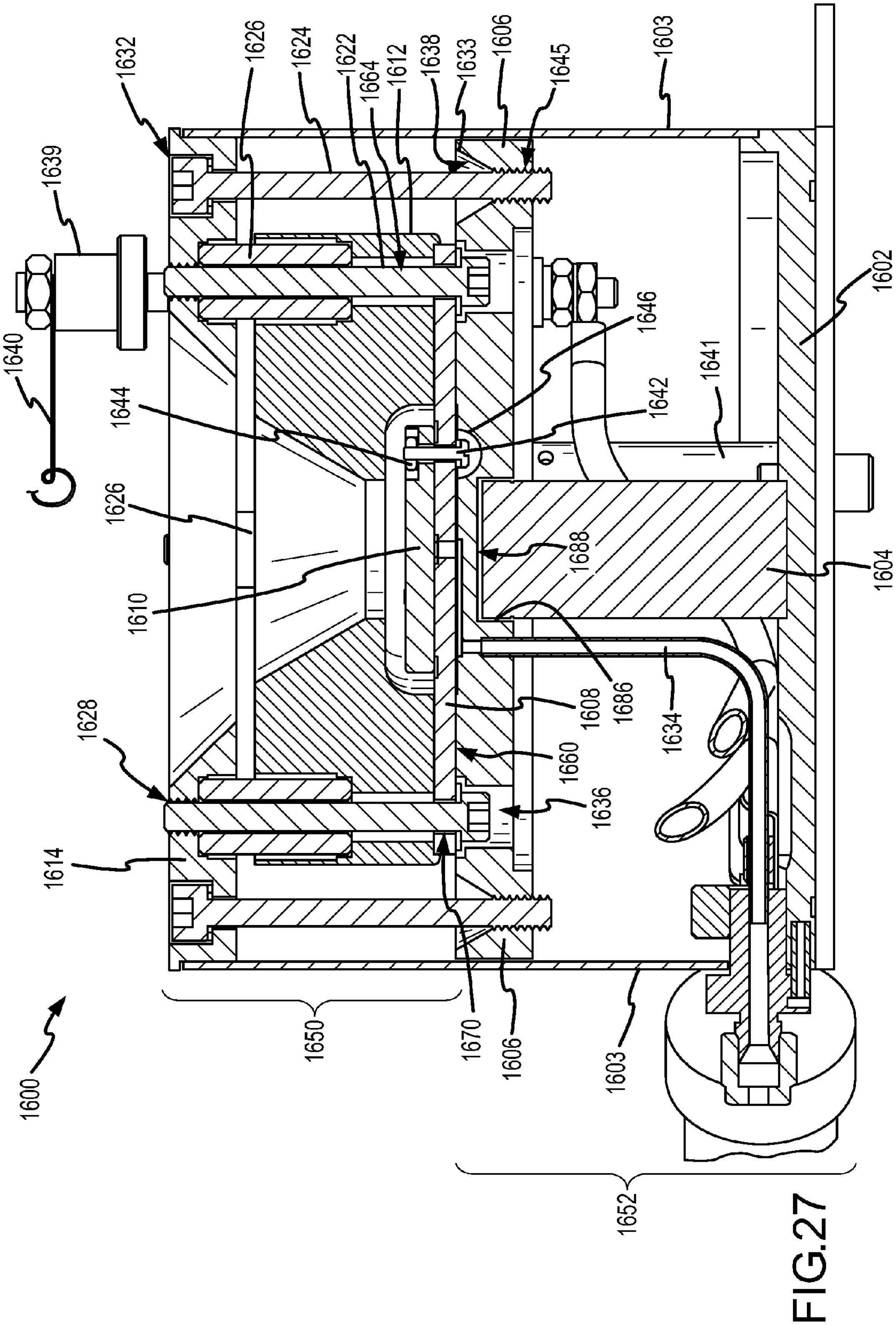
FIG. 27 is an elevation view in cross section of an implementation of a low power ion source with a removable anode assembly.

FIG. 27 depicts an implementation of a low power version of an ion source 1600 with a removable anode assembly 1650 in cross section. The ion source 1600 is built upon a base 1602, which supports a generally cylindrical magnet 1604. Note, in contrast to the high power ion source of FIGS. 15-18, the low power ion source 1600 does not have a cooling plate but instead has a thermal partition plate 1606. The thermal partition plate 1606 is positioned above the base 1602 and about the magnet 1604 and is supported by several standoff posts 1641. An anode assembly 1650 is supported on the thermal partition plate 1606. A body 1603 surrounds the base assembly 1652 and anode assembly 1650 and interfaces with the pole piece 1614 at the top and with the base 1602 at the bottom.

The anode assembly 1650 of the low power ion source 1600 is composed primarily of a thermal control plate 1608, a gas distributor 1610, an anode 1612, and a pole piece 1614. The anode assembly 1650 is supported by the thermal partition plate 1606, which is considered part of the base assembly 1652 of the ion source 1600. The thermal control plate 1608 further supports the gas distributor 1610 and the anode 1612. The pole piece 1614 is mounted above and separated from the anode 1612 to ensure electrical isolation between the anode 1612 and the pole piece 1614.

Rather than actively cooling the anode, the thermal partition plate 1606 acts as a thermal barrier to reduce the heat transfer from the anode 1612 to the magnet 1604. The thermal partition plate 1606 thereby acts to safely limit the temperature of the magnet 1604 in this lower power version of the ion source 1600 without the added cost and complexity associated with the cooling plate and thermal transfer sheets used in the higher power, actively cooled ion source 1500 of FIGS. 15-18.

The thermal control plate 1608, the gas distributor 1610, the anode 1612, and the pole piece 1614 of the low power ion source 1600 are of identical design to the corresponding components of the high power ion source 1500 of FIGS. 15-18 and are assembled in an identical fashion. However, in the low power ion source 1600, no thermal transfer sheets are interposed between these components. Without mechanically compliant thermal transfer sheets to enhance thermal conduction from the anode 1612 through the thermal control plate 1608 to the thermal partition plate 1606 and from the gas distributor 1610 through the thermal control plate 1608 to the thermal partition plate 1606, heat transfer to the magnet 1604 via thermal conduction may be significantly limited. The thermal partition plate 1606 thereby effectively provides a thermal separation or thermal barrier between the anode 1612 and the magnet 1604.

Note that one function of the thermal control plate 1608 is to provide electrical isolation between the high positive potential of the anode 1612 and the thermal partition plate 1606, which is at ground potential. Another purpose of the thermal control plate 1608 is to prevent working gas from leaking between the anode 1612 and thermal control plate 1608. The thermal control plate 1608 also insures that working gas injected through the gas duct 1634 does not pass behind and around the outside of anode 1612 by completely filling the gap between the anode 1612 and the thermal partition plate 1606. These functions are similar to the functions of the analogous component, i.e., the thermal control plate 1508 in the ion source 1500 in FIGS. 15-18. However, in contrast to the analogous thermal control plate 1508, the thermal control plate 1608 in this low power ion source 1600 actually functions more to limit thermal transfer rather than to enhance it.

The thermal partition plate 1606 may be made of non-magnetic material such as stainless steel or copper and further defines a cylindrical recess 1686 centered on the bottom side of the thermal cooling plate 1606. Further, the lengths of the magnet 1604 and the standoffs 1641 are such that, when assembled, a small cavity 1688 is formed between the end of the magnet 1604 and the recess 1686. The cavity 1688 is at the top end of the magnet 1604 rather than the bottom because the base 1602 is formed of magnetic material and the magnet 1604 is therefore attracted to and remains in direct contact with the base 1602. The cylindrical recess 1686 and cavity 1688 formed thereby acts to further limit heat transfer from the thermal partition plate 1606 to the magnet 1604. (Note that this is also true in the high power ion source 1500.)

The design of the thermal partition plate 1606 and its use without mechanically compliant thermal transfer sheets as described above is only one embodiment of thermal partition configurations envisioned for the low power source 1600. Other embodiments may include, but are not limited to, the use of surface texture and/or machined patterns on the mating surfaces of the thermal partition plate 1606, the thermal control plate 1608, and/or the anode 1612 to further limit, rather than enhance, thermal conduction between these components by decreasing the surface area available for thermal conduction.

Figure 28:
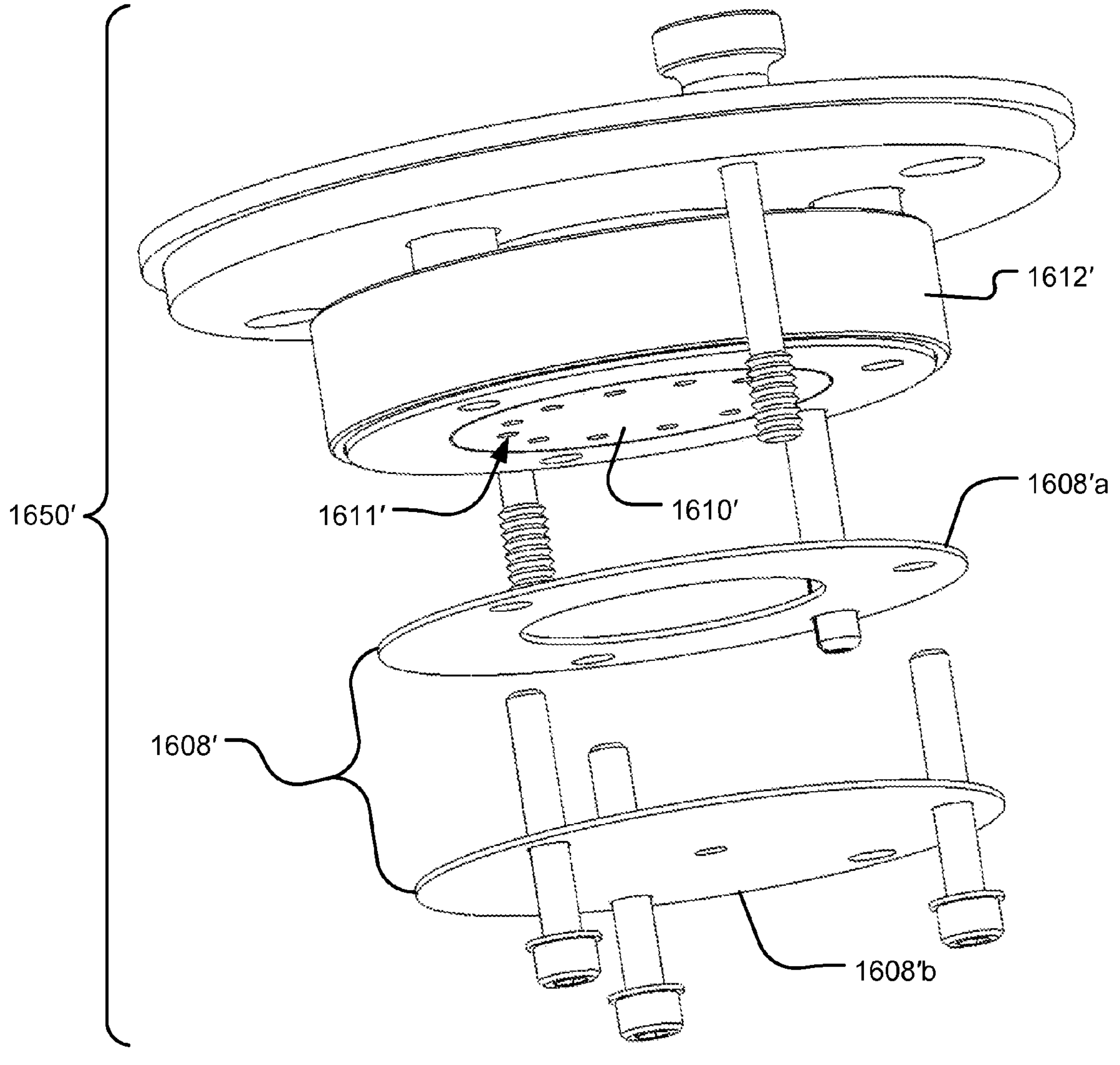
FIG. 28 is an isometric view of an alternate implementation of a removable anode assembly in a low power ion source with a layered thermal control plate.

Additional embodiments may include, but are not limited to, the use of two or more multiple, stacked sheets or layers 1608'*a*, 1608'*b* of electrically insulating material to produce a thermal control plate 1608' as a composite assembly as shown in the anode assembly 1650' of FIG. 28 in lieu of the single thermal control plate in other embodiments. The material forming the layers 1608'*a*, 1608'*b* may be, for example, high temperature ceramic, quartz, or silicon carbide sheet or plates (as described above) and/or sheets of fused mica or silica. Any such composite assembly for the thermal control plate 1608' may be used in conjunction with the gas distributor 1610' to form a gas plenum (e.g., similar to the gas plenum 1436 in FIG. 14) behind the gas distributor 1610' that would direct the gas flow and facilitate injection of the input gas into the center bottom opening of the anode 1612'. A top layer 1608'*a* of the layers 1608'*a*, 1608'*b* may define a recess or may be ring-shaped to define a void to create the gas plenum between thermal control plate 1608' and the gas distributor 1610'. In this embodiment, the gas distributor 1610' may merely fit within a recess in the bottom of the anode 1612' and may be sandwiched in place between the anode 1612' and the thermal control plate 1608'.

This alternative composite construction of the thermal control plate 1608' works well in the low power version of the ion source (i.e., without fluid cooling). In the low power ion source, the composite assembly of the thermal control plate 1608' can provide the necessary structure for directing gas around or through any type of electrically floating gas distributor 1610' (e.g., through gas path apertures 1611' in the gas distributor 1610') so as to direct the input gas to the anode 1612', yet limit the conductive or radiant thermal transfer of energy from the anode 1612' and the gas distributor 1610' to the thermal partition plate.

In another embodiment, radiation barriers may be used either independently of, together with, or integral with the thermal transfer sheets described above. Such radiation barriers may be used to limit radiation heat transfer from the anode 1612 and magnet 1604 through the various intervening components including the thermal control plate 1608, the gas distributor 1610, and the thermal partition plate 1606. Such radiation barriers may include, but are not limited to, standard radiation thermal partition techniques such as thin textured metal foil radiation shields and/or high reflectivity, low emissivity surfaces on any of the surfaces of the intervening parts.

A specific example of such a radiation shield may be in the form of a thin, reflective metal foil sheet of the size and shape of any of the thermal transfer sheets shown in any of FIGS. 20, 22, 24. These reflective sheets may have a knurled, dimpled, or otherwise raised textured surface in order to limit surface contact and thereby minimize thermal conduction across the sheets. Each such radiation shield may typically reduce radiation heat transfer by approximately 50%. In addition, such a metal foil radiation shield could be included in the cavity 1688. Various methods may be envisioned to passively enhance cooling of the magnet 1604 and/or base 1602, for example, enhancing radiation cooling by perforating the body 1603, by increasing the emissivity of the surface of the magnet 1604, and/or by adding radiation fins to the base 1602.

As depicted in FIG. 27, the gas distributor 1610 is attached to the thermal control plate 1608 by a set of three bolts 1642 and corresponding nuts 1644. The anode 1612 is bolted to both the thermal control plate 1608 and the pole piece 1614 using a set of four inner bolts 1622. The pole piece 1614 defines a set of four threaded bores 1628 designed to receive threaded ends of the inner bolts 1622. The anode 1612 similarly defines a set of four bores 1664 through which the inner bolts 1622 pass in order to engage the pole piece 1614. A tubular insulation column 1626 may surround a portion of each inner bolt 1622 as the inner bolts 1622 pass through the bores in the anode 1612. The bores 1664 are larger in diameter than the inner bolts 1622, but the inner bolts 1622 fit snugly within the shaft of the insulation columns 1626. In this manner, the inner bolts 1622 are centered within the bores 1664 and are spaced apart from, and thus insulated from, the inner walls of the bores 1664 through the anode 1612.

The inner bolts 1622 also pass upward through apertures 1670 in the thermal control plate 1608. The heads of the inner bolts 1622 interface with the bottom surface 1660 of the thermal control plate 1608. When the inner bolts 1622 are tightened within the pole piece 1614, the inner bolts 1622 thus hold the thermal control plate 1608 with the attached gas distributor 1610, the anode 1612, and the pole piece 1614 together to form the anode assembly 1650. The thermal control plate 1608, while thermally conductive, is also electrically insulating, thus, in conjunction with the insulating columns, insulating the anode 1612 from the pole piece 1614 that would otherwise be electrically coupled by the inner bolts 1622 connecting of all the anode assembly 1650 components. An exemplary thermal control plate 1608 may be a ceramic composed primarily of boron nitride.

The anode assembly 1650 is attached to the ion source base assembly 1652 by a set of four outer bolts 1624. The outer bolts 1624 extend through a set of four bores 1632 spaced equidistantly about the circumference of the pole piece 1614. The outer bolts 1624 extend downward adjacent to, but spaced apart from, the outer wall of the anode 1612.

A set of four apertures 1638 are defined within the thermal partition plate 1606 and spaced equidistantly about the circumference of the thermal partition plate 1606. Each of the apertures 1638 is formed with a frustum-shaped countersink 1633 adjacent to the top surface of the thermal partition plate 1606 to aid in the guidance of the outer bolts 1624 through the apertures 1638. The lower portion 1645 of each of the apertures 1638 is threaded. Each outer bolt 1624 is secured within a respective one of the threaded apertures 1645 within the thermal partition plate 1606, thus securing the anode assembly 1650 to the base assembly 1652.

Although various embodiments of this invention have been described above with a certain degree of particularity, or with reference to one or more individual embodiments, those skilled in the art could make numerous alterations to the disclosed embodiments without departing from the spirit or scope of this invention. All directional references (e.g., proximal, distal, upper, lower, upward, downward, left, right, lateral, front, back, top, bottom, above, below, vertical, horizontal, clockwise, and counterclockwise) are only used for identification purposes to aid the reader's understanding of the present invention, and do not create limitations, particularly as to the position, orientation, or use of the invention. Connection references (e.g., attached, interfaced, coupled, connected, and joined) are to be construed broadly and may include intermediate members between a collection of elements and relative movement between elements unless otherwise indicated. As such, connection references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the basic elements of the invention as defined in the following claims.

What is claimed is:

1. A gas distributor for incorporation in an anode assembly of an ion source, the gas distributor comprising
- a disk with a top surface and a bottom surface, wherein
- the disk defines at least two apertures for acceptance of respective fastening bolts; and
- the at least two apertures are positioned with respect to a toroid-shaped anode in the anode assembly such that the at least two apertures are positioned outside an inner diameter of the toroid-shaped anode.

2. The gas distributor of claim 1, wherein the at least two apertures are through-holes within the disk.

3. The gas distributor of claim 2, wherein the at least two apertures further comprise a counterbore within the top surface.

4. The gas distributor of claim 3, wherein the counterbore recess is of a depth substantially equivalent to or slightly greater than a thickness of a nut that is threaded on a respective one of the fastening bolts.

5. The gas distributor of claim 3, wherein the counterbore recess is of a depth substantially equivalent to or slightly greater than a thickness of a head of a respective one of the fastening bolts.

6. The gas distributor of claim 1, wherein a circumferential edge of the disk adjacent to the top surface is beveled.

7. The gas distributor of claim 1, wherein a circumferential edge of the disk adjacent to the top surface is rounded.

8. The gas distributor of claim 1, wherein the at least two apertures comprise three apertures.

9. The gas distributor of claim 8, wherein the three apertures are spaced equidistantly about and adjacent to an outer circumference of the gas distributor.

10. The gas distributor of claim 1, wherein the at least two apertures are threaded.

11. The gas distributor of claim 10, wherein the at least two apertures are blind holes formed in the bottom surface of the disk.

12. The gas distributor of claim 1, wherein the bottom surface of the disk is substantially flat.

13. The gas distributor of claim 1, wherein the gas distributor comprises at least one material selected from a group consisting of stainless steel, graphite, molybdenum, titanium, tantalum, quartz, and ceramic.

14. The gas distributor of claim 1, wherein the gas distributor comprises a thickness between the top surface and the bottom surface between 0.100 and 0.250 inches.

15. A gas distributor for incorporation in an anode assembly of an ion source, the gas distributor comprising
- a disk with a top surface and a bottom surface, wherein
- the disk defines three apertures spaced equidistantly about and adjacent to an outer circumference of the gas distributor for acceptance of respective fastening bolts;
- each of the three apertures comprises a counterbore of a depth substantially equivalent to or slightly greater than a thickness of a nut that is threaded on a respective one of the fastening bolts; and
- the three apertures are positioned with respect to a toroid-shaped anode in the anode assembly such that the three apertures are positioned outside an inner diameter of the toroid-shaped anode.

16. The gas distributor of claim 15, wherein a circumferential edge of the disk adjacent to the top surface is beveled.

17. The gas distributor of claim 15, wherein a circumferential edge of the disk adjacent to the top surface is rounded.

18. A gas distributor for incorporation in an anode assembly of an ion source, the gas distributor comprising
- an annular clamping ring; and
- a plate component retained within the annular clamping ring.

19. The gas distributor of claim 18, wherein
- the annular clamping ring further defines at least two apertures for acceptance of respective fastening bolts; and
- the at least two apertures are positioned with respect to a toroid-shaped anode in the anode assembly such that the at least two apertures are positioned outside an inner diameter of the toroid-shaped anode.

20. The gas distributor of claim 19, wherein the at least two apertures are threaded.

21. The gas distributor of claim 18, wherein
- the annular clamping ring defines a first inner diameter and a second inner diameter forming a first circumferential ledge;
- the plate component defines a first outer diameter and a second outer diameter forming a second circumferential ledge; and
- the first circumferential ledge mates with the second circumferential ledge.

22. The gas distributor of clam 18, wherein the plate component defines one or more gas path apertures through which a gas may pass.

23. A gas distributor for incorporation in an anode assembly of an ion source, the gas distributor comprising
- an annular fastening component sized with respect to a toroid-shaped anode in the anode assembly such that the fastening component is positioned outside an inner diameter of the toroid-shaped anode; and
- a consumable component sized to fit within the inner diameter of the toroid-shaped anode and secured within the anode assembly by the annular fastening component.

24. The gas distributor of claim 23, wherein the consumable component is sized to fit within an inner diameter of the annular fastening component.

25. The gas distributor of claim 23, wherein the consumable component defines one or more gas path apertures through which a gas may pass.

* * * * *